United States Patent [19]

Sakui et al.

[11] Patent Number: 4,943,944
[45] Date of Patent: Jul. 24, 1990

[54] SEMICONDUCTOR MEMORY USING DYNAMIC RAM CELLS

[75] Inventors: Koji Sakui; Tsuneaki Fuse, both of Tokyo; Fujio Masuoka, Yokohama, all of Japan

[73] Assignee: Kabushiki Kaisha Toshiba, Kawasaki, Japan

[21] Appl. No.: 275,501

[22] Filed: Nov. 23, 1988

[30] Foreign Application Priority Data

| Nov. 25, 1987 | [JP] | Japan | 62-296813 |
| Nov. 25, 1987 | [JP] | Japan | 62-296814 |
| Nov. 25, 1987 | [JP] | Japan | 62-296815 |
| Nov. 25, 1987 | [JP] | Japan | 62-296822 |
| Nov. 25, 1987 | [JP] | Japan | 62-296823 |

[51] Int. Cl.$^5$ .............................. G11C 7/00
[52] U.S. Cl. ...................... 365/189.05; 365/203; 365/210; 365/149
[58] Field of Search ............ 365/189.05, 203, 205, 365/208, 210, 149

[56] References Cited

U.S. PATENT DOCUMENTS 4,758,987 7/1988 Sakui ........................... 365/189.05
4,780,850 10/1988 Miyamoto et al. ............ 365/205 X

FOREIGN PATENT DOCUMENTS 61-142592 6/1986 Japan .

*Primary Examiner*—Joseph A. Popek
*Attorney, Agent, or Firm*—Oblon, Spivak, McClelland, Maier & Neustadt

[57] ABSTRACT

Bit-line pairs and word lines are disposed perpendicular to one another and dRAM cells are placed at their intersections. A dummy cell is connected to each of the bit-line pairs. A bit-line sense amplifier and an equalizer are connected to one end of the bit-line pair. The other end of the bit-line pair is connected to a latch type memory cell via a first transfer gate. The latch type memory cell are further connected to input/output line pair via a second transfer gate controlled by a column select line. During a RAS active period in a read cycle a word line is selected so that data is read from a dRAM cell and the dummy cell connected to the selected word line onto the bit-line pairs. The bit-line sense amplifiers are activated so that the levels of the bit lines become determinate. The first transfer gates are subsequently turned on to transfer the data on the bit-line pairs to the latch type cells. After the memory cells are rewritten into, the selected word line is reset and the latch type memory cells are electrically disconnected from the bit-line pairs. The equalizers operate to precharge the bit-line pairs. When CAS is rendered active and a column is selected, a corresponging second transfer gate is turned on so that data in the latch type memory cell is read out onto the input/output line pairs.

21 Claims, 35 Drawing Sheets

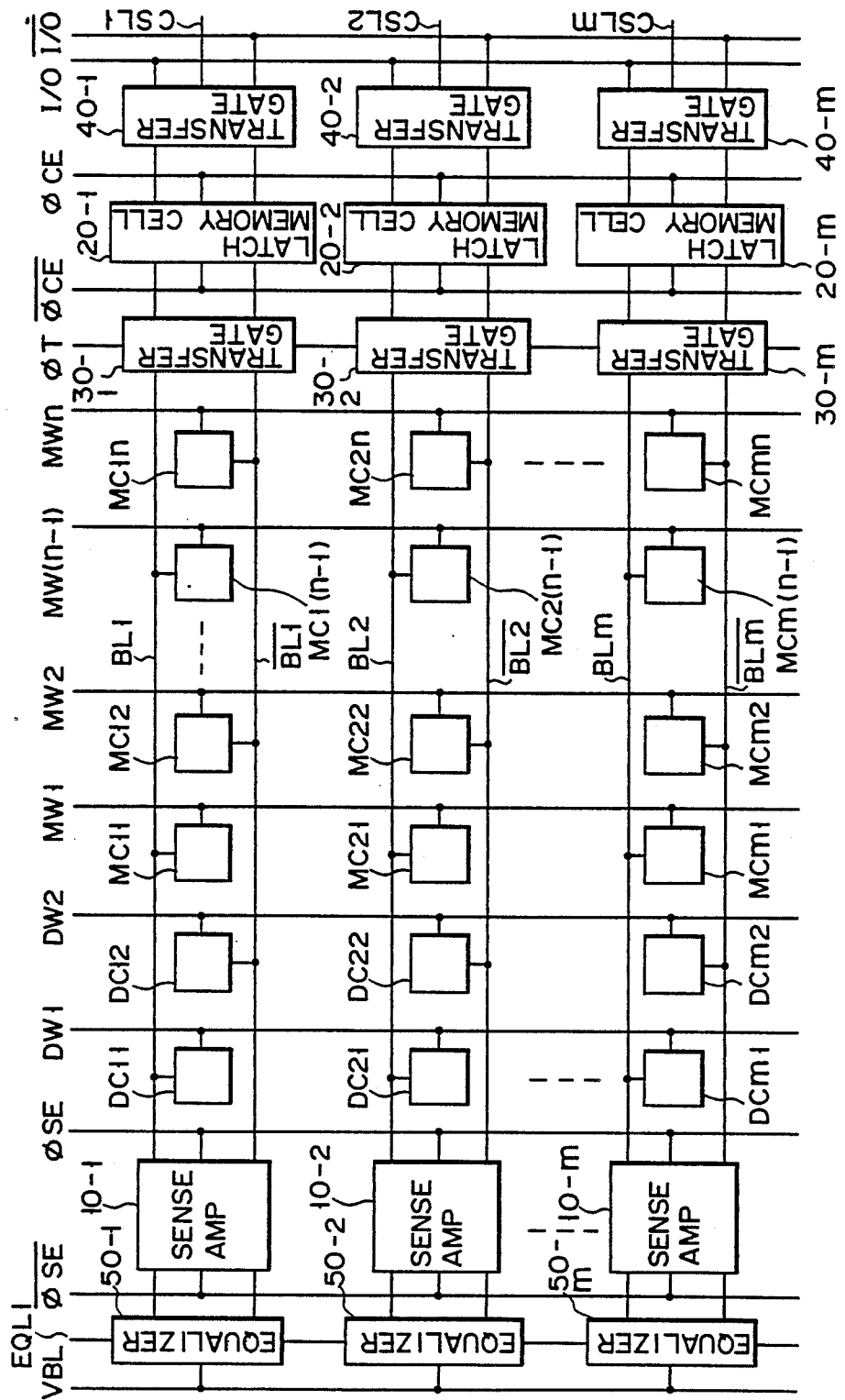
F I G. 1

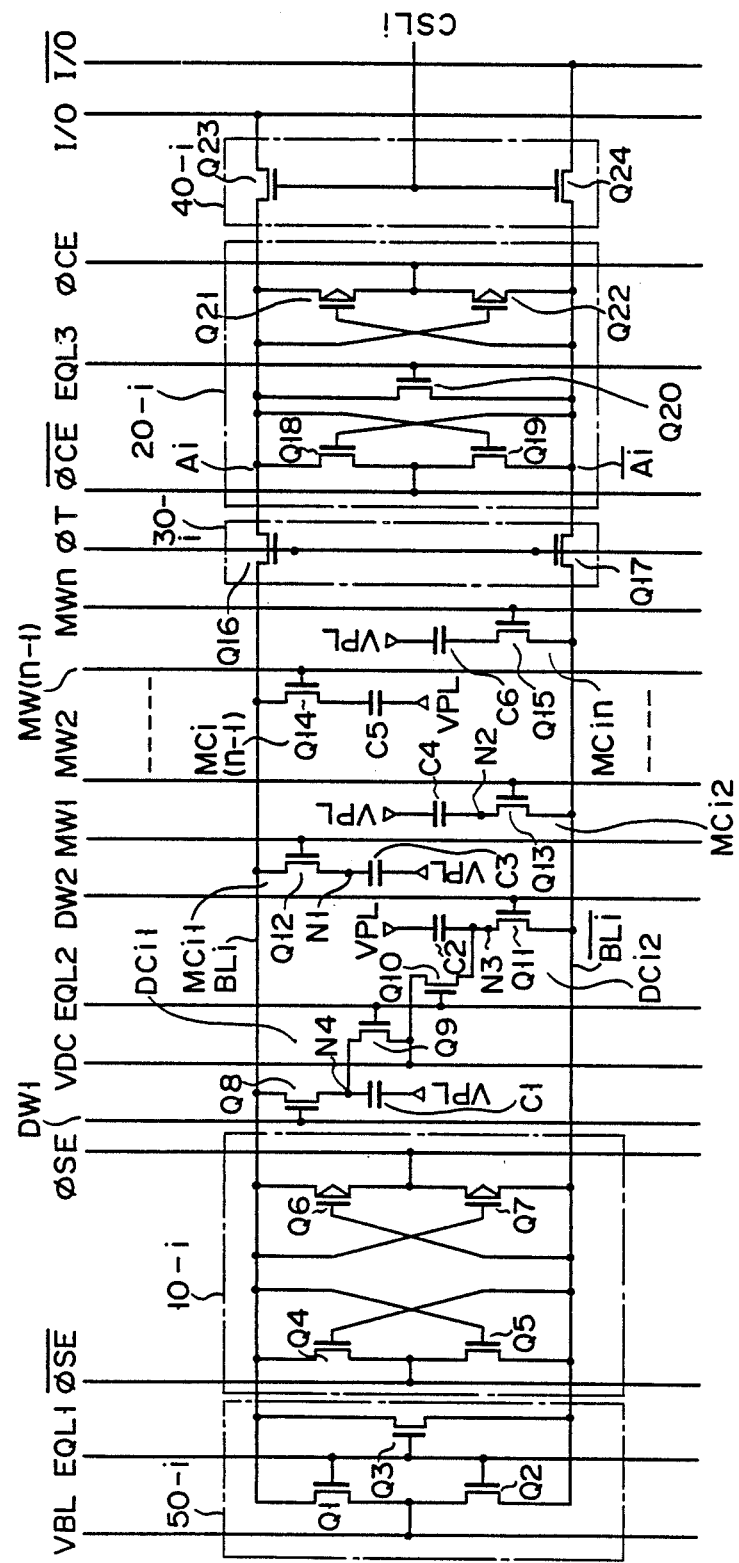
F I G. 2

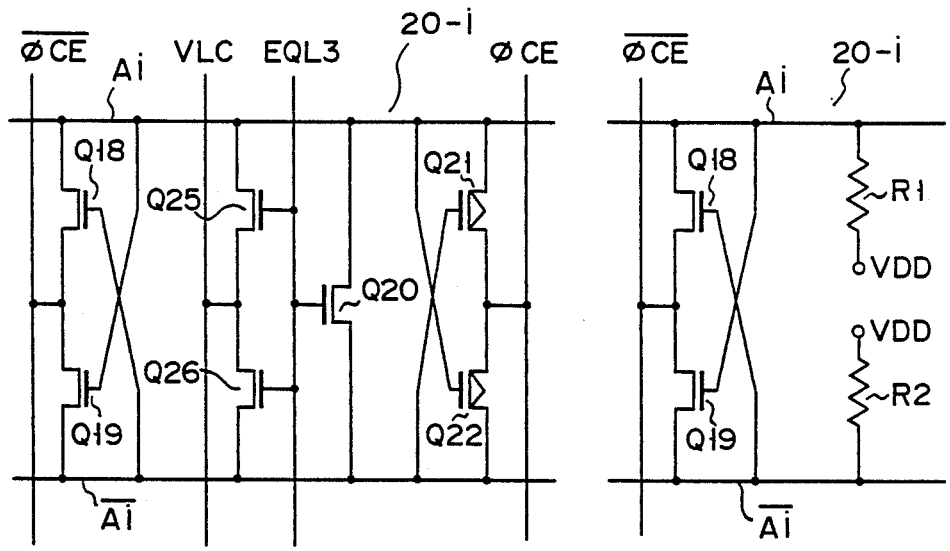
F I G. 4  F I G. 5
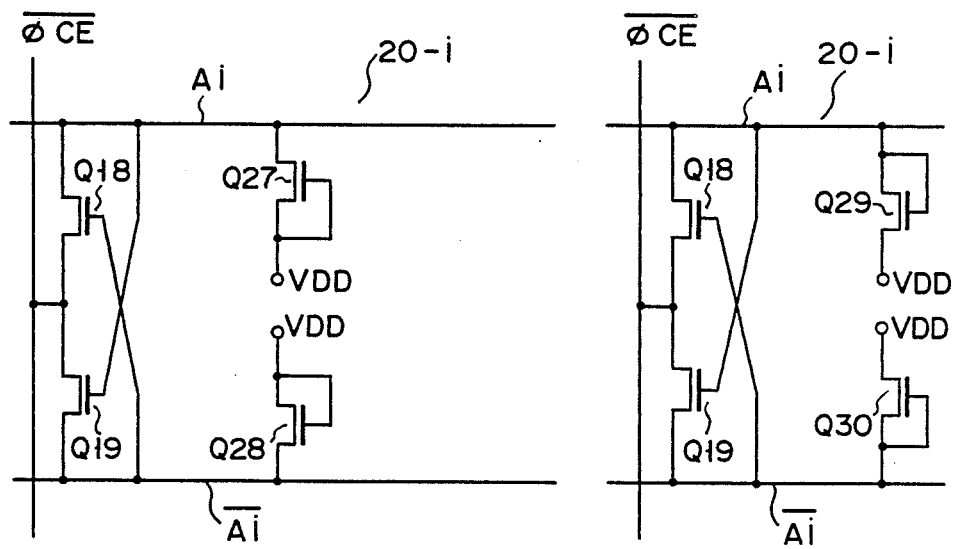
F I G. 6  F I G. 7

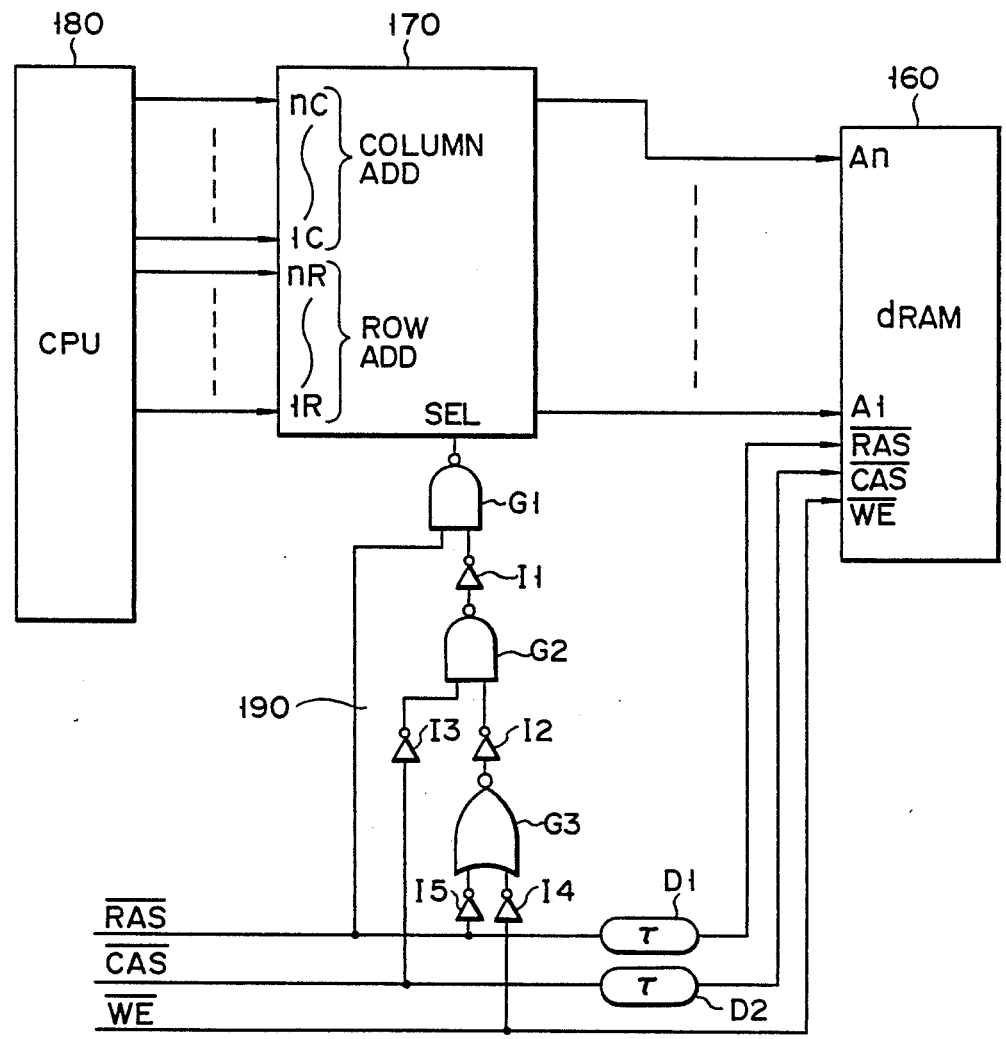
F I G. 8

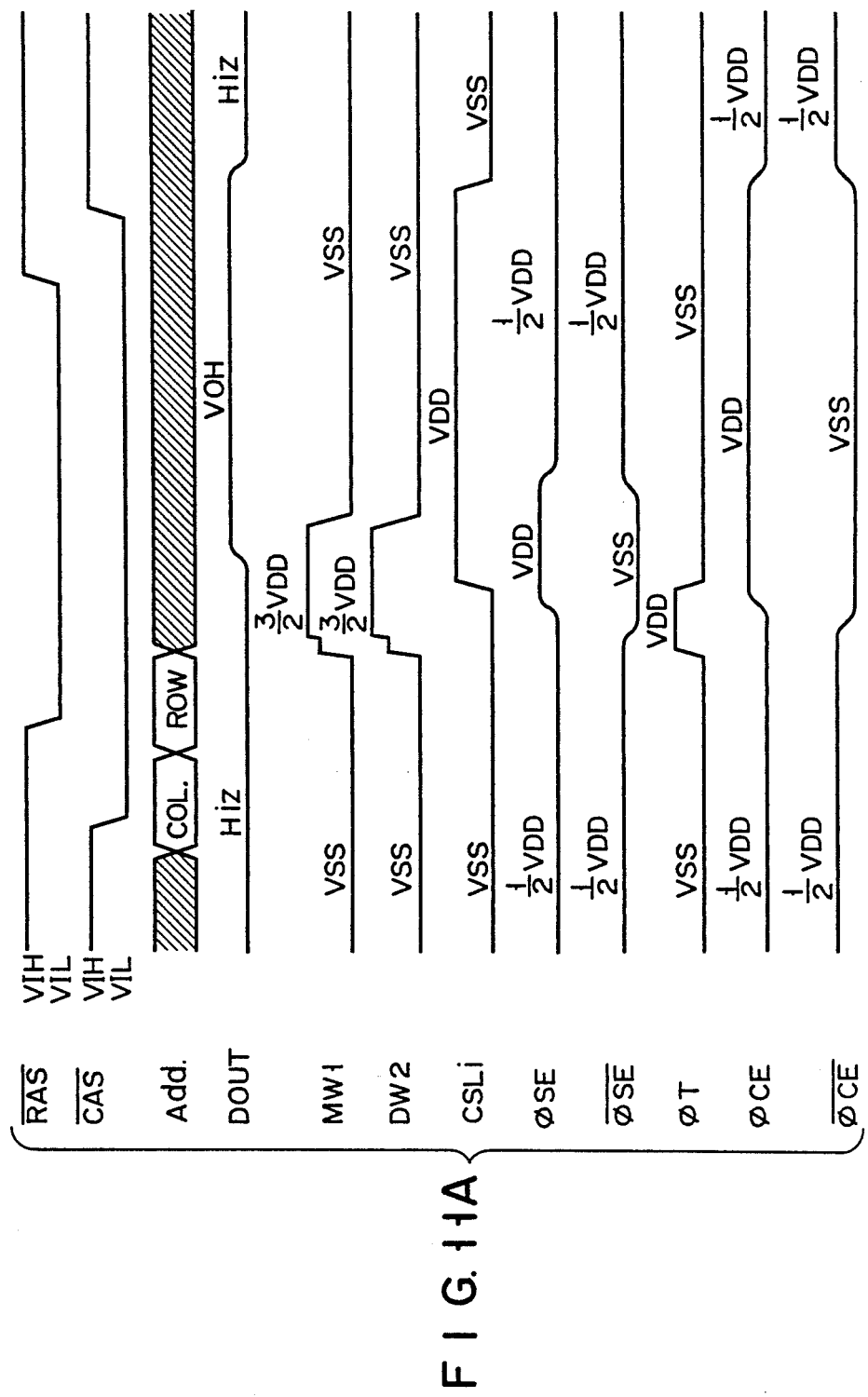
F I G. 11A

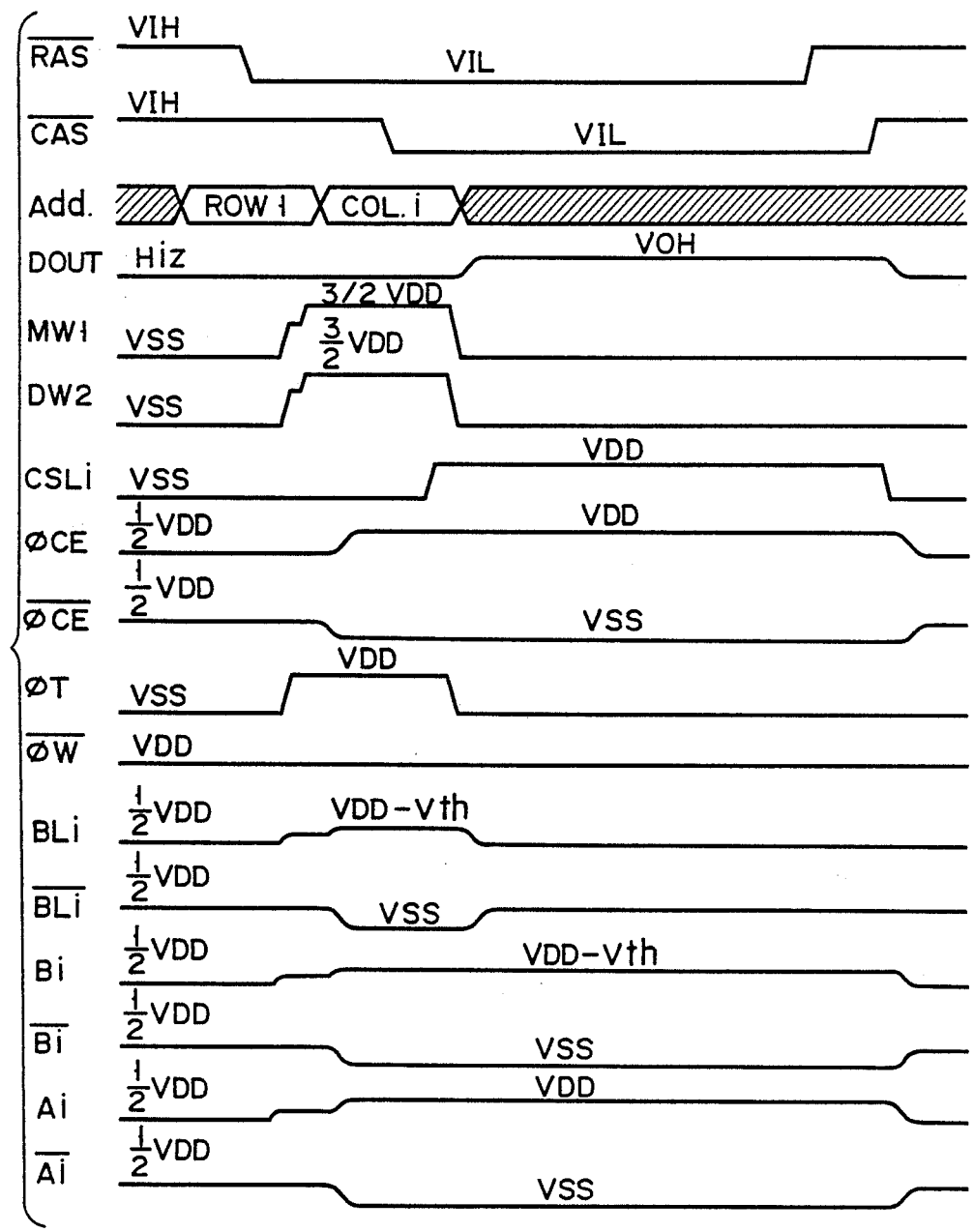
F I G. 15A

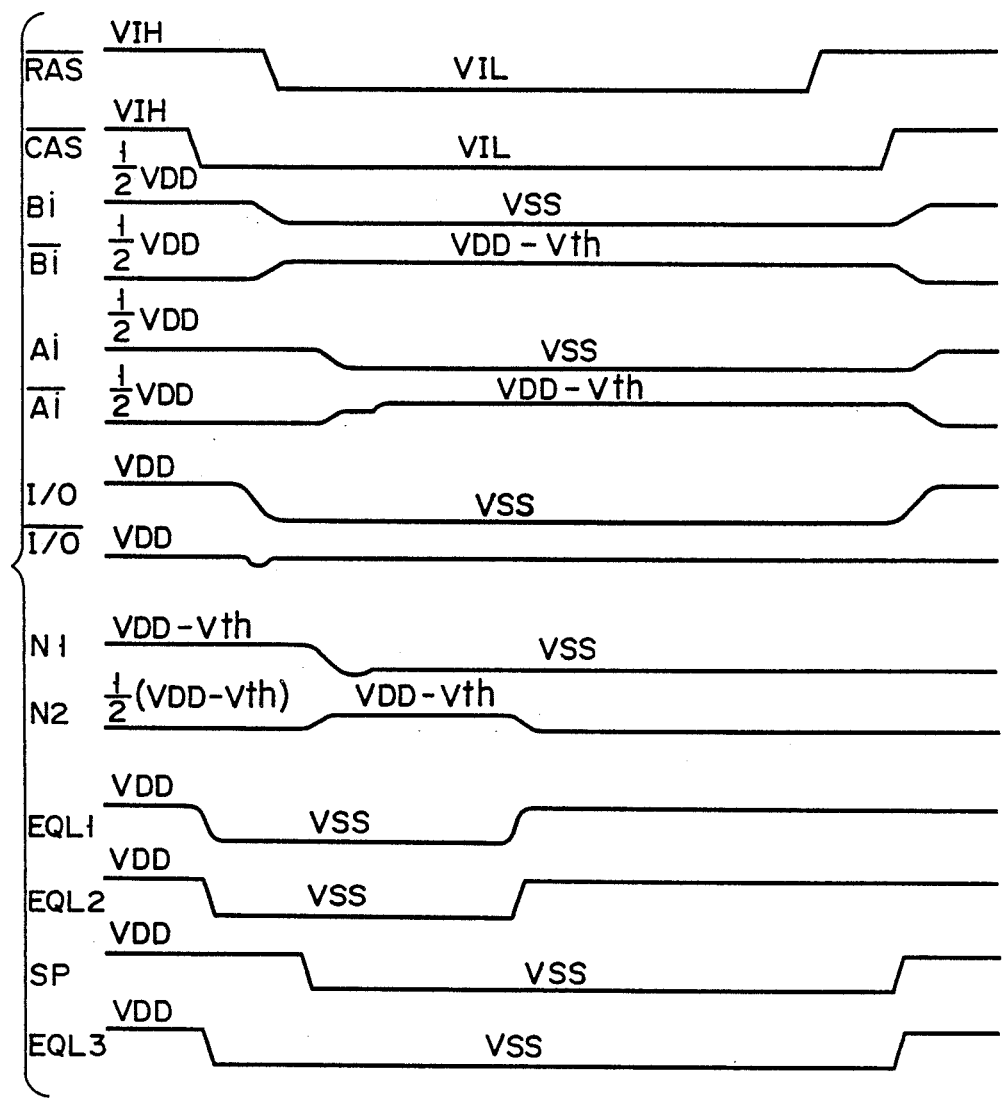
F I G. 16B

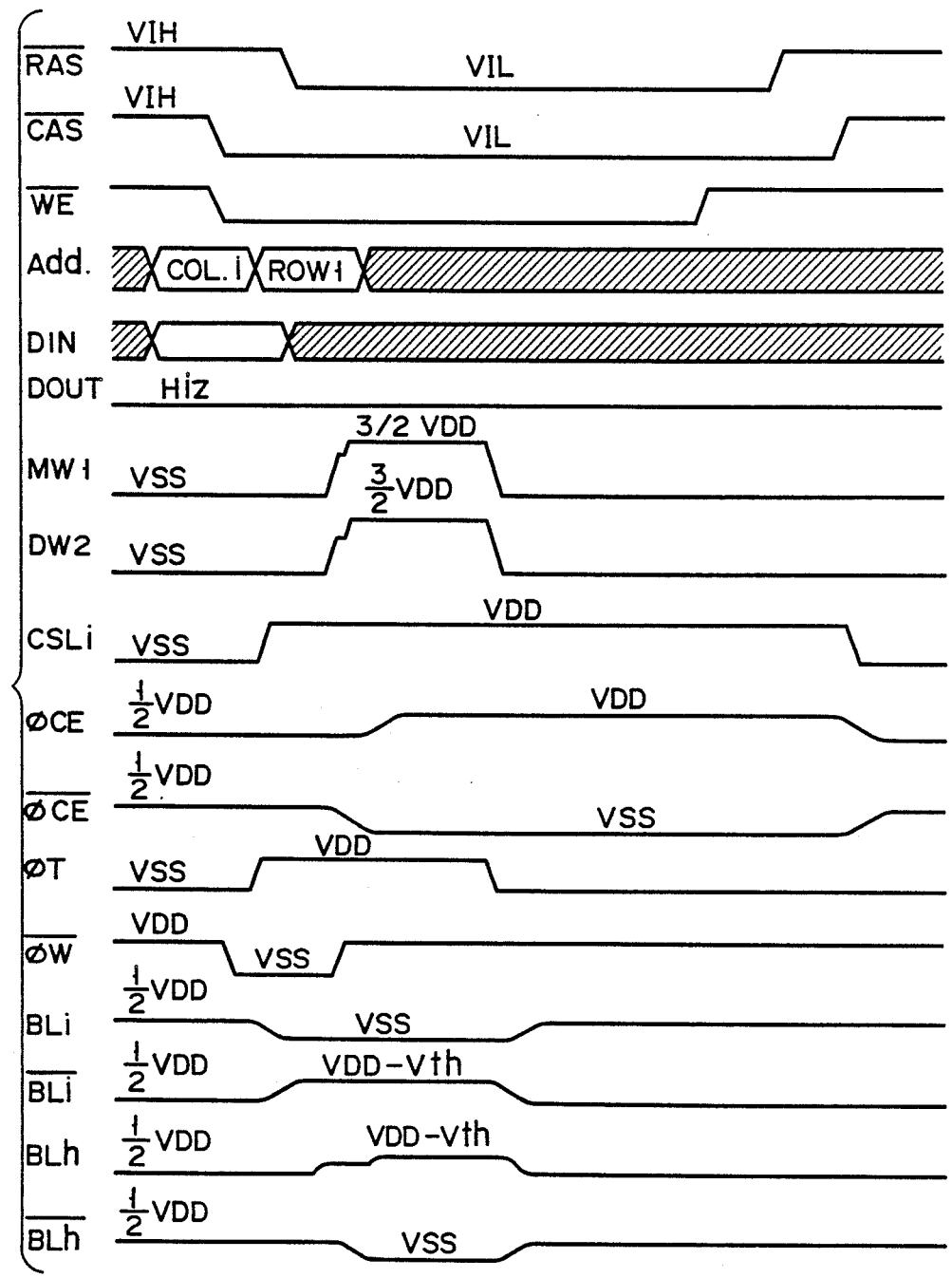
F I G. 16A

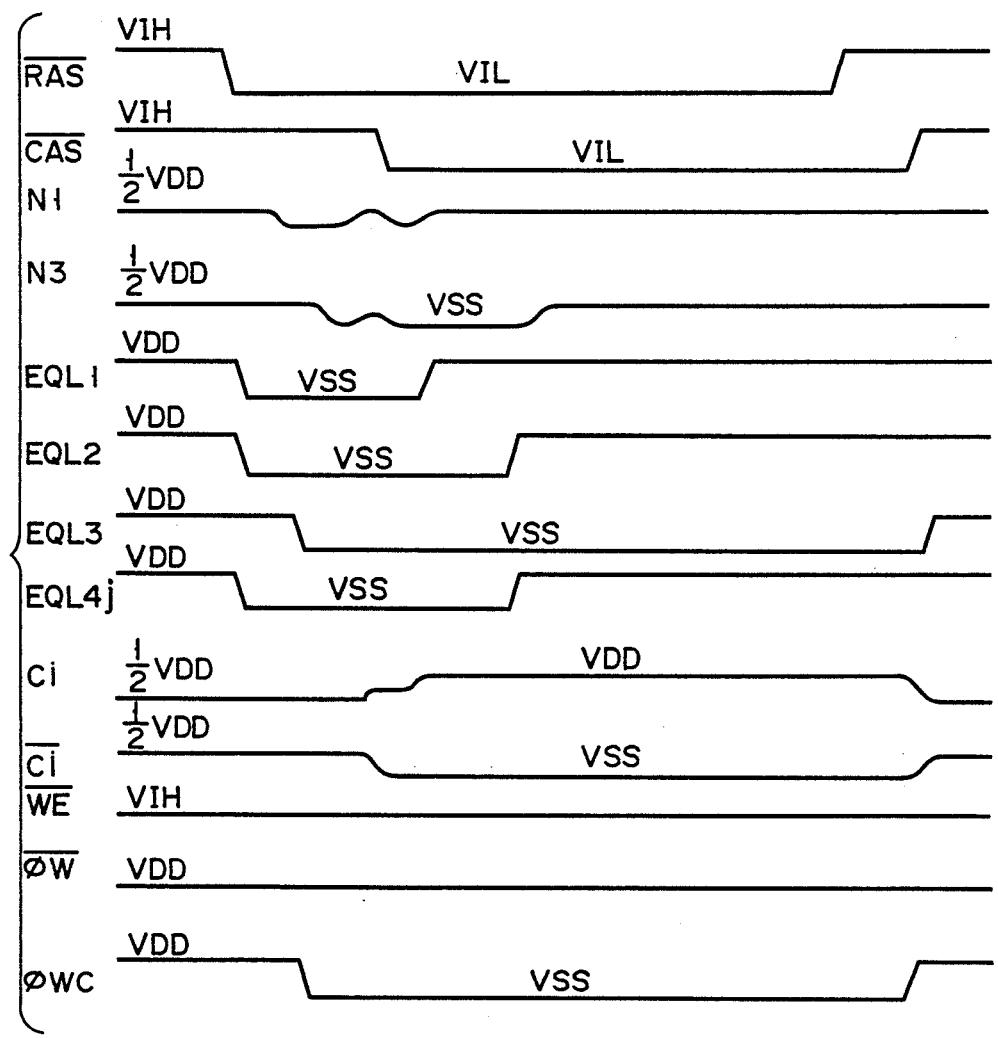
F I G. 22B

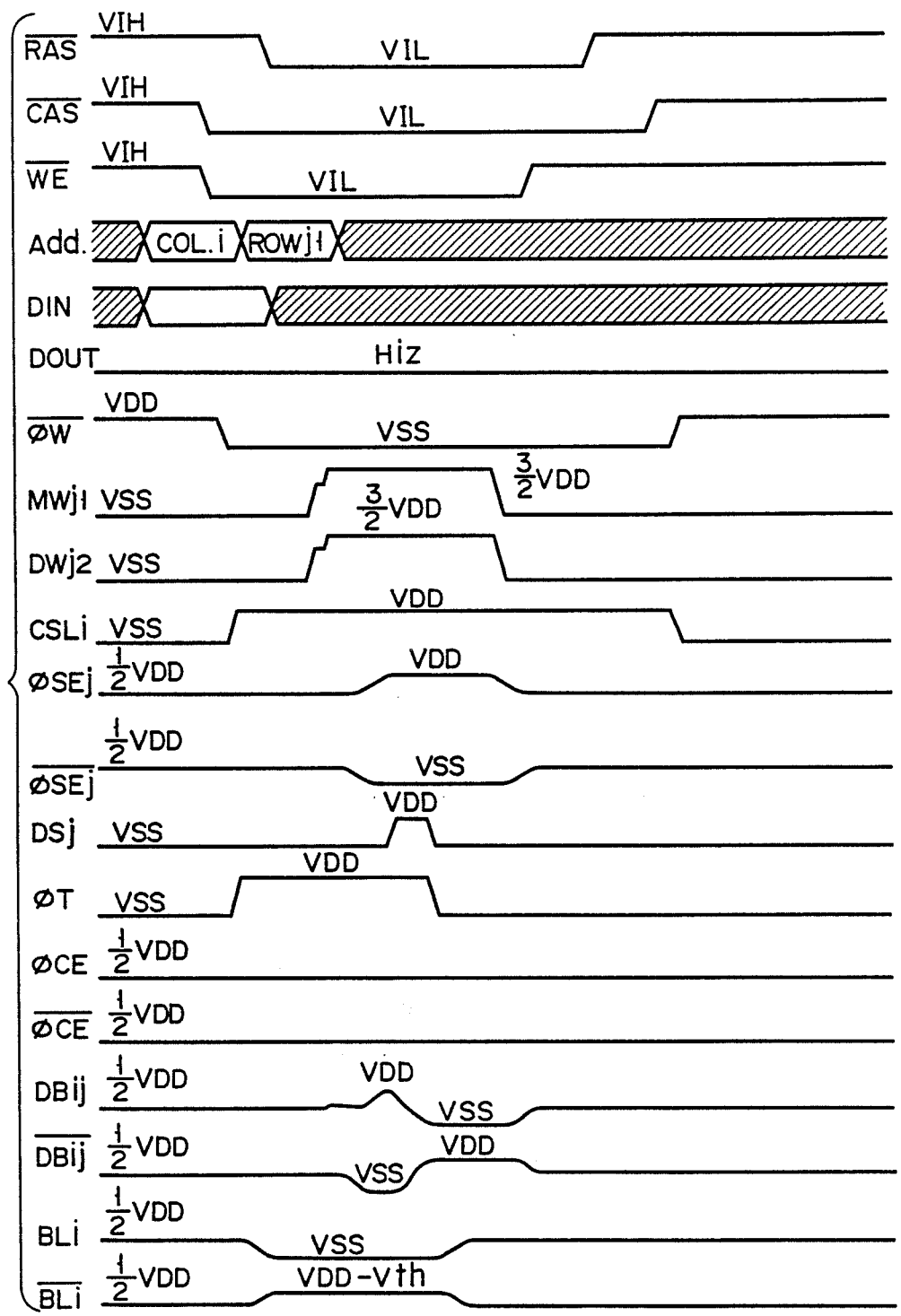
F I G. 23A

SEMICONDUCTOR MEMORY USING DYNAMIC RAM CELLS

BACKGROUND OF THE INVENTION

1. Field of the Invention

The present invention relates to integrated semiconductor memories using dynamic RAMs (dRAMs) containing dynamic memory cells for destructive readout.

2. Description of the Related Art

Recently many inventions and developments have been made to speed up semiconductor memories. The semiconductor memories include dRAMs and sRAMs (static RAMs). The dRAMs are superior to the sRAMs in storage capacity and cost, but inferior in speed. The reason why the dRAMs are inferior to the sRAMs in speed is that the dRAMs are increased in integration density by the use of an address multiplexing method in order to decrease their cost per bit. The fact that dRAMs need refreshing and bit-line precharging because they are of destructive-read type may also be attributed to their low-speed operation. With computers using the sRAMs as their main memories, their machine cycle is determined only by an access time to the sRAM. Where the dRAMs are used as main memories, the machine cycle is determined by their access time and bit-line precharging time.

For that reason, in the conventional dRAMs, various operation modes, such as a page mode, a nibble mode and a static column mode, have been developed to shorten the access time.

However, a problem with the conventional dRAMs is that, even if the access time is reduced in a normal access mode, the cycle time is not so reduced. For example, with a 1M-bit dRAM having an access time of 100 nsec in the normal access mode, the cycle time is 190 nsec in its specification because it is a sum of an active time and the precharging time. Even if the access time is reduced by half, the cycle time will not be halved unless the precharging time is also reduced by half. The difficulty in reducing the precharging time is due not only to the fact that the capacitive loads of bit lines to be charged have been increased to increase the storage capacity of the dRAMs, but also to the fact that the bit lines are precharged and equalized during a precharging period in which an RAS signal (row address strobe signal for loading the row address into the memory device) goes from a logic "0" to a logic "1", not during an active period to read or write data.

Where semiconductor memories are installed in computers, the length of machine cycle is an important factor in the performance of the computers. In the static RAMs, since the access time and the cycle time coincide with each other, the reduction of the access time will also reduce the machine cycle. In the dynamic RAMs, however, the reduction of the access time alone will not lead to the reduction of the machine cycle.

In the conventional dRAMs of address multiplexing type, there is no distinction between a read cycle and a write cycle because an address data selector is controlled by a CAS signal (column address strobe for loading the column address into the memory device) only. That is, during an active cycle, a row address strobe (RAS) is input into the dRAM prior to the CAS. The row address and the column address are issued in this sequence from the address data selector and then entered into a dRAM chip. To secure operational margin surely, a certain time is needed from when the RAS is made active until the CAS is made active. It is thus difficult to shorten the cycle time of the dRAMs and hence the machine cycle of computers using the dRAMs.

As described above, the conventional dRAMs have a problem that the reduction of the access time does not lead to the reduction of the cycle time, and thus the machine cycle of the computers using the dRAMs cannot be reduced.

SUMMARY OF THE INVENTION

It is a first object of the present invention to provide a semiconductor memory using a dRAM which saves the need for a precharging time for bit lines, which is conventionally separate from an access time, and thus reduces its cycle time.

It is a second object of the present invention to provide a dRAM semiconductor memory of address-multiplexing type which enables a high-speed write operation.

It is a third object of the present invention to provide a dRAM semiconductor memory with divided bit-line structure which saves the need for a precharging time for bit lines and thus reduces its cycle time.

The first object is achieved by connecting a latch means to bit lines and initiating precharging of the bit lines after, during a RAS active time period, data is transferred from a memory cell connected to a selected word line to the latch means via the bit lines.

The second object is achieved by, in an address multiplexing dRAM semiconductor memory, loading a column address first by inputting a CAS, and then a row address by inputting a RAS in both a read cycle and a write cycle and writing data into a bit line pair or a circuit immediately preceding the bit line pair during the write cycle.

The third object is achieved by, in a dRAM semiconductor memory of a divided bit-line configuration, connecting a latch means between main bit lines and input/output lines and transferring data between the dRAM and the outside while precharging the main bit lines and sub bit lines.

BRIEF DESCRIPTION OF THE DRAWINGS

FIG. 1 is a block diagram of a semiconductor memory device according to a first embodiment of the present invention;

FIG. 2 is a circuit diagram of a portion of the first embodiment;

FIG. 4 shows a first modification of a latch-type memory cell of the first embodiment;

FIG. 5 shows a second modification of the latch-type memory cell of the first embodiment;

FIG. 6 shows a third modification of the latch-memory cell of the first embodiment;

FIG. 7 shows a fourth modification of the latch-type memory cell of the first embodiment;

FIG. 8 is a block diagram of a semiconductor memory according to a second embodiment of the present invention;

FIGS. 11A and 11B show waveforms of signals indicating the operation in a readout cycle of a third embodiment;

FIGS. 15A and 15B show waveforms of signals indicating the operation in a readout cycle of the fourth embodiment;

FIGS. 16A and 16B show waveforms of signals indicating the operation in a write cycle of the fourth embodiment;

FIGS. 22A and 22B show waveforms of signals indicating the operation in a readout cycle of the sixth embodiment; and FIGS. 23A and 23B show waveforms of signals indicating the operation in a write cycle of the sixth embodiment.

DETAILED DESCRIPTION OF THE PREFERRED EMBODIMENTS

Figure 3A:
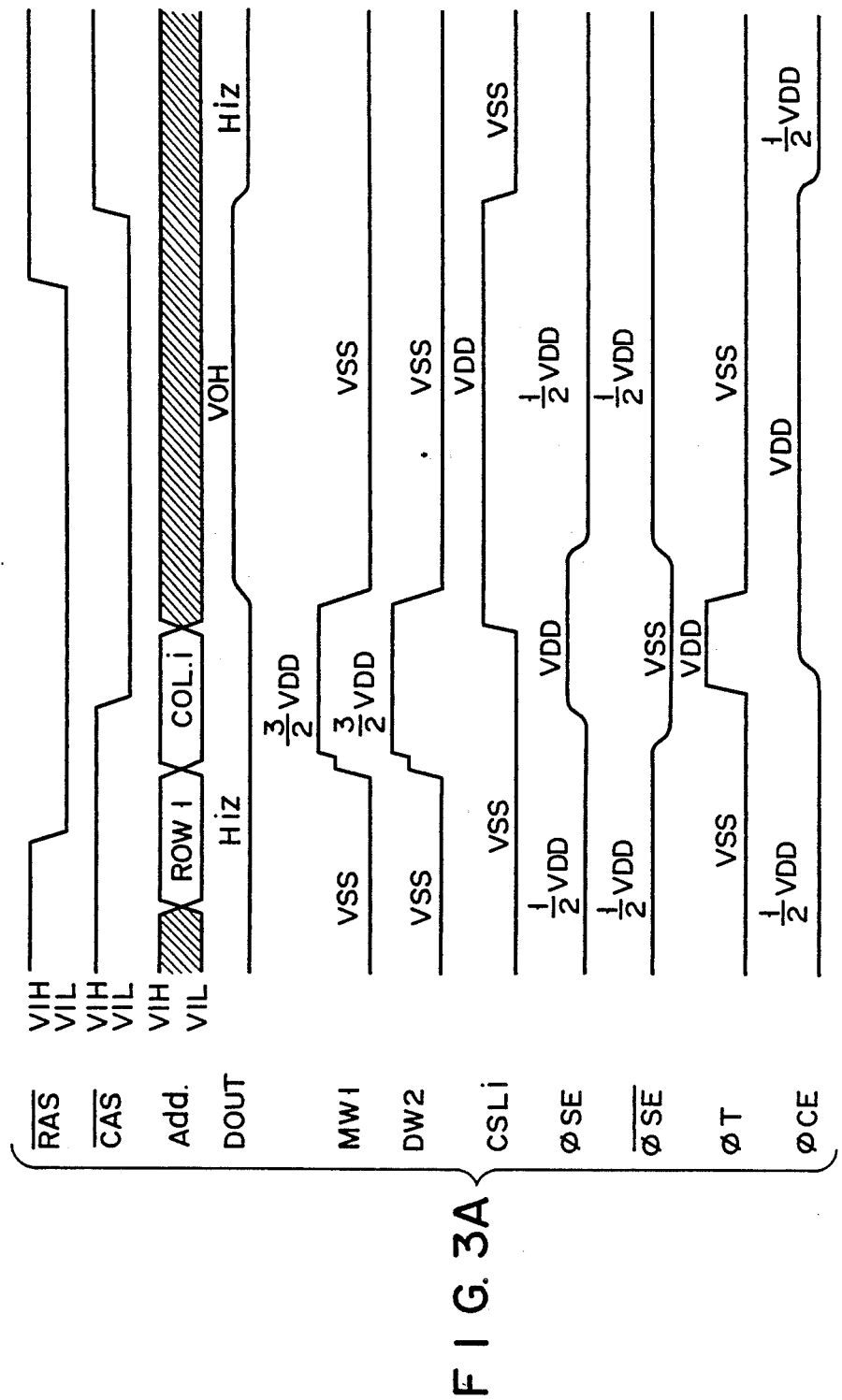
FIGS. 3A and 3B show waveforms of signals indicating the operation in a readout cycle of the first embodiment.

Referring now to FIG. 1, there is shown the overall structure of a first embodiment of the present invention. Over a semiconductor substrate not shown, plural pairs of bit lines $BLi$, $\overline{BLi}$ ($i=1\sim m$) and plural word lines $MWj$ ($j=1\sim n$) are disposed perpendicular to each other and dRAM cells MCij are placed at their intersections. Each dRAM cell MCij is selectively driven by word line MWj so that data is transferred between bit lines BLi and $\overline{BLi}$. In addition to the dRAM cells, dummy cells DCi1 and DCi2 are coupled to bit-line pair BLi and $\overline{BLi}$ of each row. Dummy cells DCi1 and DCi2 are driven by dummy word lines DW1 and DW2, respectively.

A bit-line sense amplifier 10-i is coupled to ends of bit lines BLi, $\overline{BLi}$ for each of rows in order to detect the level of data read out onto BLi and $\overline{BLi}$.

To equalize and precharge bit lines BLi, $\overline{BLi}$, an equalizer 50-i is coupled to sense amplifier 10-i. Equalizer 50-i is connected with a bit-line precharging power supply VBL and also supplied with an equalizing signal EQL1.

The other ends of bit lines BLi, $\overline{BLi}$ are coupled to a latch type memory cell (hereinafter, is called as latch memory cell) 20-i via a first transfer gate 30-i which is supplied with a control signal $\phi T$. Latch memory cell 20-i is supplied with activation signals $\phi CE$ and $\overline{\phi CE}$. Outputs of latch memory cell 20-i are coupled to input/output lines I/O and $\overline{I/O}$ via a second transfer gate 40-i which is supplied with a column select signal CSLi.

FIG. 2 shows a specific arrangement of the dRAM of FIG. 1, particularly a detailed circuit diagram for one row. The dRAM cell MC and dummy cell DC are of a well known type comprised of one transistor and one capacitor. A reference potential terminal of the capacitor is connected to a plate power supply VPL. Dummy cells DCi1 and DCi2 include n channel MOS transistors Q9 and Q10, respectively, which are connected to a precharging power supply VDC, for data-writing.

Bit line amplifier 10-i is comprised of a pair of n channel MOS transistors Q4 and Q5 and another pair of p channel MOS transistors Q6 and Q7. Activation signals $\phi SE$ and $\overline{\phi SE}$ applied are to the respective pairs of Q4, Q5 and Q7, Q8 at their sources connected in common.

Equalizer 50-i is comprised of three n-channel MOS transistors Q1, Q2, Q3 which are supplied at their gates with equalize signal EQL1. Transistors Q1 and Q2 are adapted for precharging and have their sources connected to bit lines BLi and $\overline{BLi}$, respectively, with their drains connected to precharging power supply VBL in common. Transistor Q3 is adapted for equalizing and have its source and drain connected to bit lines BLi and $\overline{BLi}$, respectively.

Latch memory cell 20-i includes a flip-flop comprised of a pair of n channel MOS transistors Q18 and Q19 and a flip-flop comprised of a pair of p channel MOS transistors Q21 and Q22. Activation signals $\phi CE$ and $\overline{\phi CE}$, acting as latch clocks, are applied to the common source connections of the transistor pairs, respectively. Q20 is an n-channel MOS transistor used for equalizing. Nodes Ai and $\overline{Ai}$ of latch memory cell 20-i described above are coupled to bit lines BLi, $\overline{BLi}$ via n channel MOS transistors Q16 and Q17, respectively, which form first transfer gate 30-i. On the other hand, nodes Ai and $\overline{Ai}$ are also coupled to input/output lines I/O and $\overline{IO}$ via n channel MOS transistors Q23 and Q24, respectively, which form second transfer gate 40-i. First transfer gate 30-i is controlled by control signal $\phi T$, while second transfer gate 40-i is controlled by column select signal CSLi selected by a column address.

The operation of the dRAM with such an arrangement as described above will be described hereinafter.

Figure 3B:
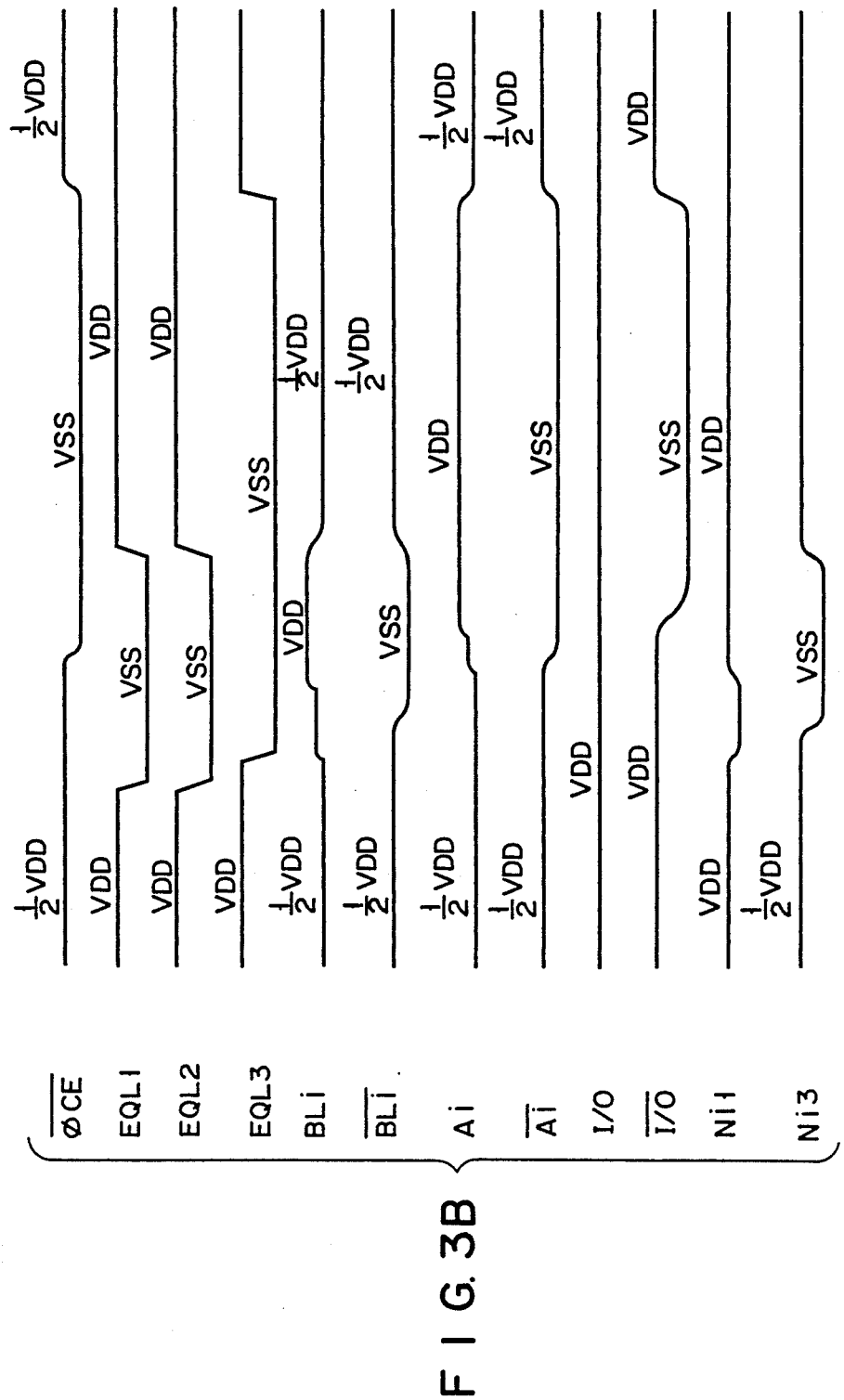

FIGS. 3A and 3B are a timing diagram showing the operation during a read cycle. Here, an operation, in a system in which bit lines BLi and $\overline{BLi}$ are precharged to ($\frac{1}{2}$) VDD, for transferring data in latch memory cell 20-i to input/output lines I/O and $\overline{I/O}$ will be indicated.

In the beginning of operation, since bit-line equalize signal EQL1 is at the VDD level and precharging power supply VBL provides ($\frac{1}{2}$) VDD volts, all of the bit lines BL and $\overline{BL}$ are precharged to ($\frac{1}{2}$) VDD. Assume now that VDD (logic "1") is written into a node N1 between capacitor C3 and transistor Q12 of dRAM cell MCi1 associated with the i-th bit lines BLi and $\overline{BLi}$. Furthermore, assume that a node N3 between capacitor C2 and transistor Q11 of dummy cell DCi2 is initially set to ($\frac{1}{2}$) VDD level by write power supply VDC.

When the $\overline{RAS}$ goes from logic "1" level (VIH) to logic "0" level (VIL), the operation goes into an RAS active mode. As a result, equalize signals EQL1 and EQL2 go from VDD volts down to VSS volts so that bit lines BLi and $\overline{BLi}$ are electrically disconnected from each other, and node N3 of dummy cell DCi2 assumes a floating state.

Subsequently, for example, when word line MW1 is selected and this line and dummy word line DW2 are raised to (3/2) VDD level, the stored data in dRAM cell MCi1 and dummy cell DCi2 are read out onto bit lines BLi and $\overline{BLi}$, respectively. At the same time, equalize signal EQL3 of latch memory cell 20-i decreases from VDD volts to VSS volts.

Subsequently, n-channel transistor activation signal $\overline{\phi SE}$ decreases from (½) VDD volts to VSS volts, and then p-channel transistor activation signal $\phi SE$ increases from (½) VDD volts to VDD volts. As a result, bit line BLi onto which logic "1" data has been read out is raised to VDD, while bit line $\overline{BLi}$ to which data in dummy cell DCi2 has been read out is lowered to VSS.

Control signal $\phi T$ subsequently goes from VSS to VDD causing first transfer gate 30-i to turn on. When activation signal $\overline{\phi CE}$ goes from (½) VDD to VSS and $\phi CE$ goes from (½) VDD to VDD, the contents of bit lines BLi and $\overline{BLi}$ are transferred to nodes Ai and $\overline{Ai}$ of latch memory 20-i.

At a time when the data on bit lines BLi and $\overline{BLi}$ are thus transferred into latch memory cell 20-i, if a write trigger signal $\overline{WE}$ generated outside the dRAM chip is at logic "1" and hence the operation is in a read mode, then the bit-line precharge will be initiated automatically. The precharge operation will be described next.

After memory cell MCi1 selected for readout has sufficiently been restored (rewritten), selected word line MWi1 and dummy word line DW2 are lowered in potential from (3/2)VDD to VSS causing latch memory cell 20-i to be electrically disconnected from bit lines BLi and $\overline{BLi}$.

Bit-line equalize signal EQL1 goes from VSS to VDD causing equalizer 10 to precharge the bit lines. In this case, when $\overline{CAS}$ clock goes from logic "1" to logic "0", if the i-th column is selected, column select signal CSLi is raised in level from VSS to VDD or (3/2) VDD causing second transfer gate 40-i to turn on and nodes Ai and $\overline{Ai}$ of latch memory cell 20-i to be electrically connected to input/output lines I/O and $\overline{I/O}$. When the i-th column is selected, I/O remains at VDD, $\overline{I/O}$ is lowered from VDD to VSS, and an output terminal Dout (not shown) connected to input/output lines I/O and $\overline{I/O}$ goes from high-impedance level (Hiz) to logic "1" level (VOH).

If the column select signal CSLi goes to VDD when control signal $\phi T$ is at VDD and first transfer gate 30-i in the on state, bit lines BLi and $\overline{BLi}$ and nodes Ai and $\overline{Ai}$ of latch memory cell 20-i are simultaneously electrically connected to input/output lines $\overline{I/O}$ and I/O, in which case the data on bit lines BLi and $\overline{BLi}$ are directly read out onto input/output lines I/O and $\overline{I/O}$.

As described above, according to the present invention, by the provision of a latch memory cell at ends of bit lines in order to temporally store data read out of a dRAM cell, the bit lines can be precharged during a RAS active time. That is, the latch memory cell, which enables data to be read from or written into during a bit-line precharge time, is provided between the paired bit lines and the input/output lines, and when the $\overline{RAS}$ goes from logic "1" to logic "0", a word line is selected so that data in the dRAM cell is transferred to the latch memory. In this case, if the $\overline{CAS}$ is pulled down to logic "0" prior to the $\overline{RAS}$, a column select line can be selected to read out data to the outside immediately after the selection of the word line. Thereafter by turning off the transfer gate between the bit lines and the latch memory cell, the bit lines can be precharged while the $\overline{RAS}$ remains at logic "0". In other words, precharging the bit lines can be performed during a RAS active time, which has been performed in the prior art during a RAS precharge time other than the RAS active time. As a result, the cycle time can be shortened. This is very effective for speeding up computers using large-capacity dRAMs as their main memories.

In the above embodiment, the precharged level of the bit lines is (½) VDD. Alternatively, the precharged level may be VDD. BICMOS circuits (circuits using a combination of bipolar transistors and CMOS transistors) may be used in the sense amplifier and its peripheral circuits. Furthermore, latch memory cell 20-i may be modified in various ways as shown in FIGS. 4 through 7.

FIG. 4 shows a first modification of the latch memory cell 20-i which is modified such that precharging n-channel MOS transistors Q25 and Q26 are added. The drains of transistors Q25 and Q26 are connected together to precharging power supply VLC. The transistors are controlled by equalize signal EQL3 so that the nodes Ai and $\overline{Ai}$ of the latch memory cell 20-i are initially set to VLC (e.g., (½) VDD). As precharging power supply VLC the precharging power supply VBL for the bit lines may be used.

In a second modification of FIG. 5, p-channel MOS transistors Q21 and Q22 of the first embodiment are replaced with load resistances R1 and R2, respectively, for connection to VDD. Resistances R1 and R2 may be formed of polysilicon, for example. In this modification, the initial level of activation signal $\phi CE$ is chosen to be VDD so that nodes Ai and $\overline{Ai}$ are initially set to the VDD level.

FIG. 6 shows a third modification which uses n-channel MOS transistors Q27 and Q28 in place of resistances R1 and R2 of FIG. 5. In this case, transistors Q27 and Q28 are of enhancement type and each act as a load with drain and gate connected together. As a result, the initial level of nodes Ai and $\overline{Ai}$ will be set to VDD–Vth. Vth stands for the threshold voltage of Q27, Q28.

FIG. 7 shows a fourth modification which uses n-channel MOS transistors Q29 and Q30 of depletion type as loads. In this case, transistors Q29 and Q30 each have its gate connected to its source. In this arrangement, the initial level of nodes Ai and $\overline{Ai}$ will be set to VDD.

A second embodiment of the present invention will be described next. The second embodiment is arranged to precharge, like the first embodiment, bit lines in an address-multiplexing type dRAM. That is, a read cycle and a write cycle are made different from each other in the input sequence of an row address and a column address. The overall block diagram is shown in FIG. 8. The arrangement of the dRAM is the same as that in the first embodiment and thus the description thereof is considered to be unnecessary.

Referring to FIG. 8, an address data selector 170 is connected between a dRAM chip 160 and a CPU 180. Address data applied from CPU 180 to address data selector 170 has 2n bits. The n high-order bits of the address data are used as a column address and the n low-order bits as a row address. Address data selector 170 in turn applies the column address and the row address to address inputs A1–An of dRAM chip 160.

Address data selector 170 has a select control terminal SEL adapted to determine which of the column address and the row address is to be output first. The level of a signal applied to select control terminal SEL is determined by a gate circuit 190 according to a combination of levels of $\overline{RAS}$, $\overline{CAS}$ and $\overline{WE}$. When among $\overline{RAS}$, $\overline{CAS}$ and $\overline{WE}$, $\overline{RAS}$ first goes from logic "1" to logic "0", gate circuit 190 applies a signal of logic "1" to control terminal SEL. When control terminal SEL is at logic "1" level, address data selector 170 issues the row address first. After that, $\overline{CAS}$ goes to logic "0" level causing control terminal SEL to go to logic "0" level. As a result, the column address is issued from address data selector 170. The above relates to a read cycle.

For a write cycle, on the other hand, $\overline{CAS}$ and $\overline{WE}$ go to logic "0" level prior to $\overline{RAS}$ and thus the control signal from gate circuit 190 goes to logic "0", causing the column address to be issued first. Subsequently, $\overline{RAS}$ goes to logic "0" level, causing the row address to be issued from address data selector 170.

It is to be noted here that delay circuits D1 and D2 are connected to $\overline{RAS}$ and $\overline{CAS}$ input terminals, respectively, of dRAM chip 160. This is to provide a setup time for an input address to dRAM chip 160.

The operation of the dRAM of the second embodiment described above will be described hereinafter.

Figure 9A:
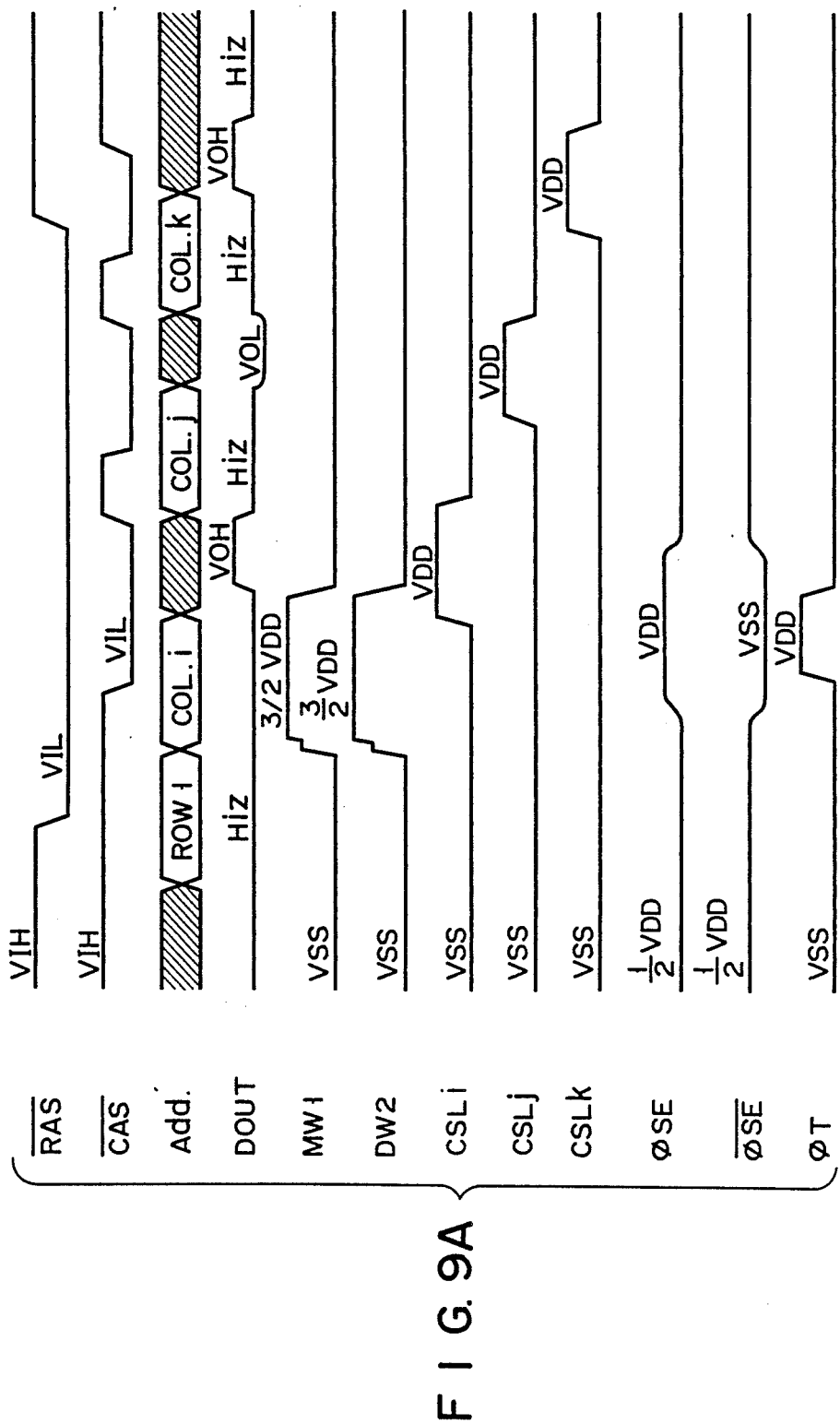
FIGS. 9A, 9B, and 9C show waveforms of signals indicating an operation in a readout cycle of the second embodiment.
Figure 9B:
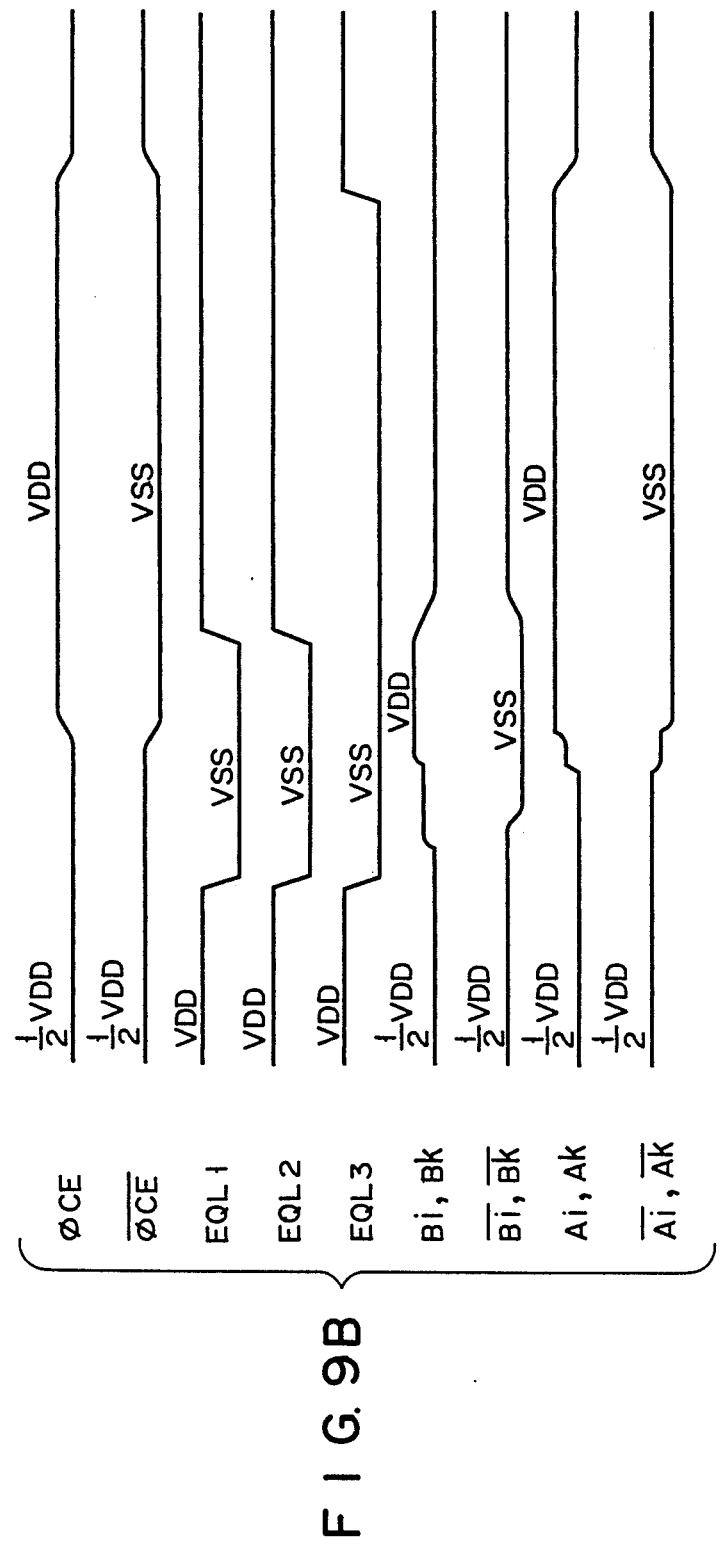
Figure 9C:
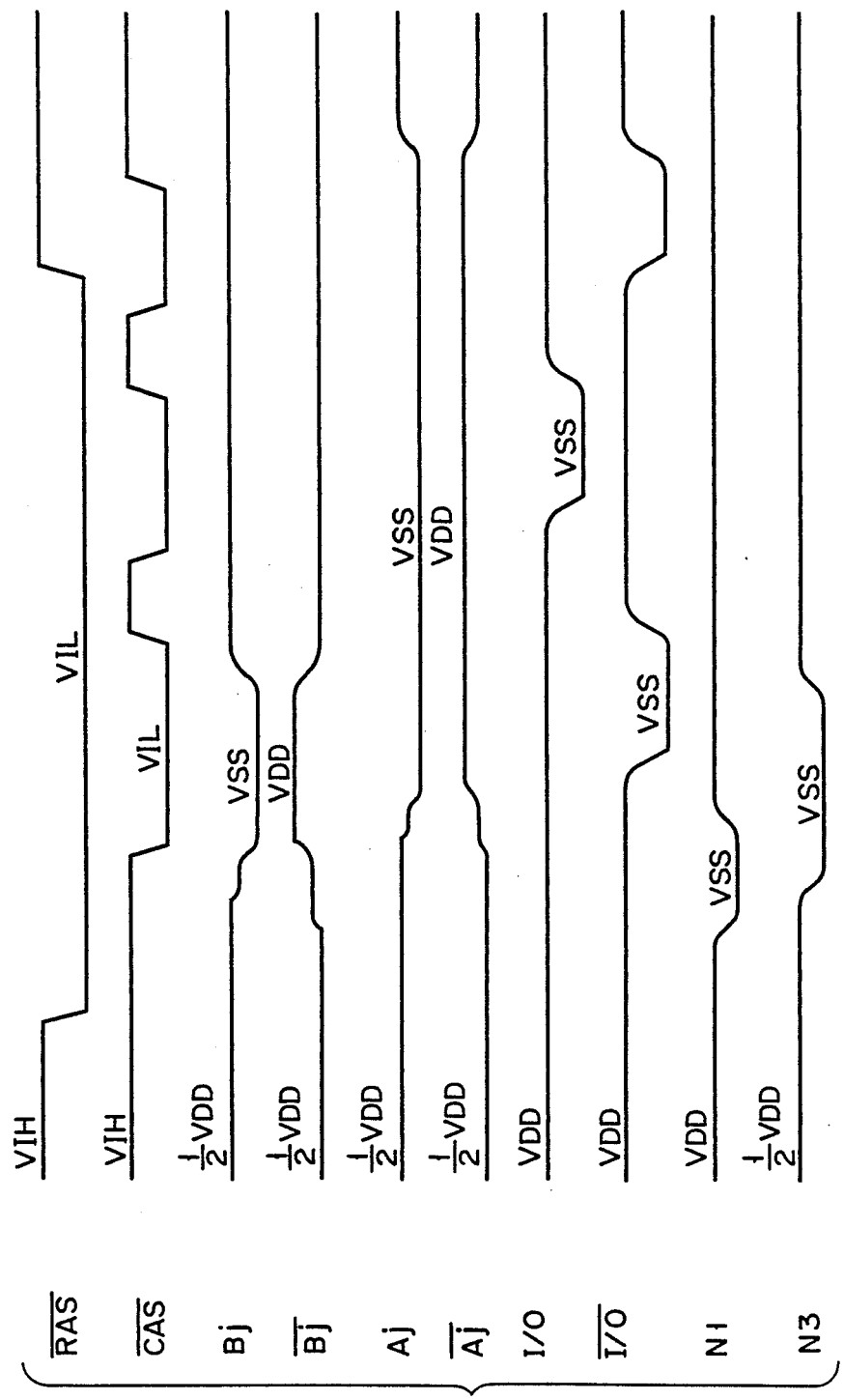
Figure 10A:
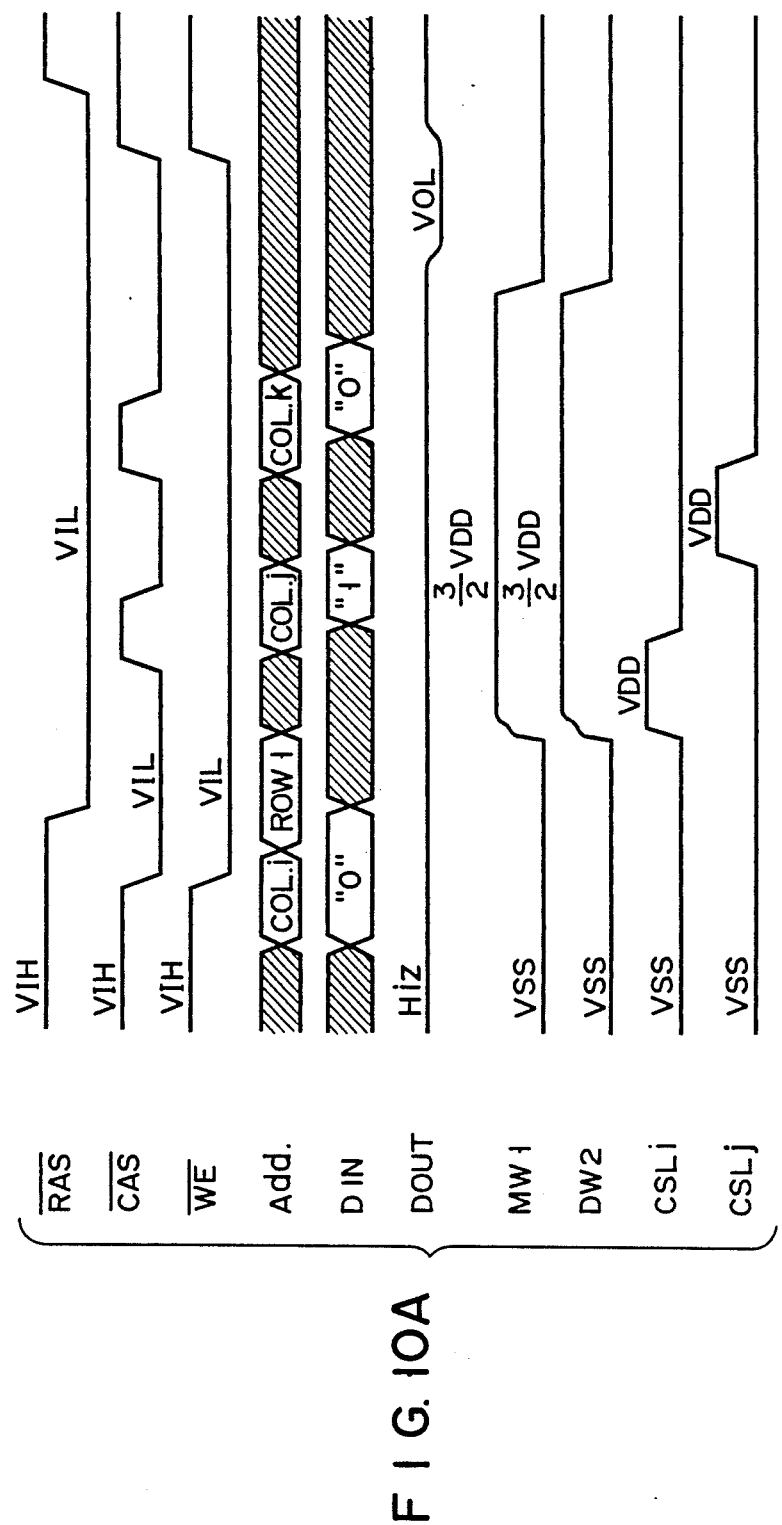
FIGS. 10A, 10B, 10C, and 10D show waveforms of signals indicating the operation in a write cycle of the second embodiment.
Figure 10B:
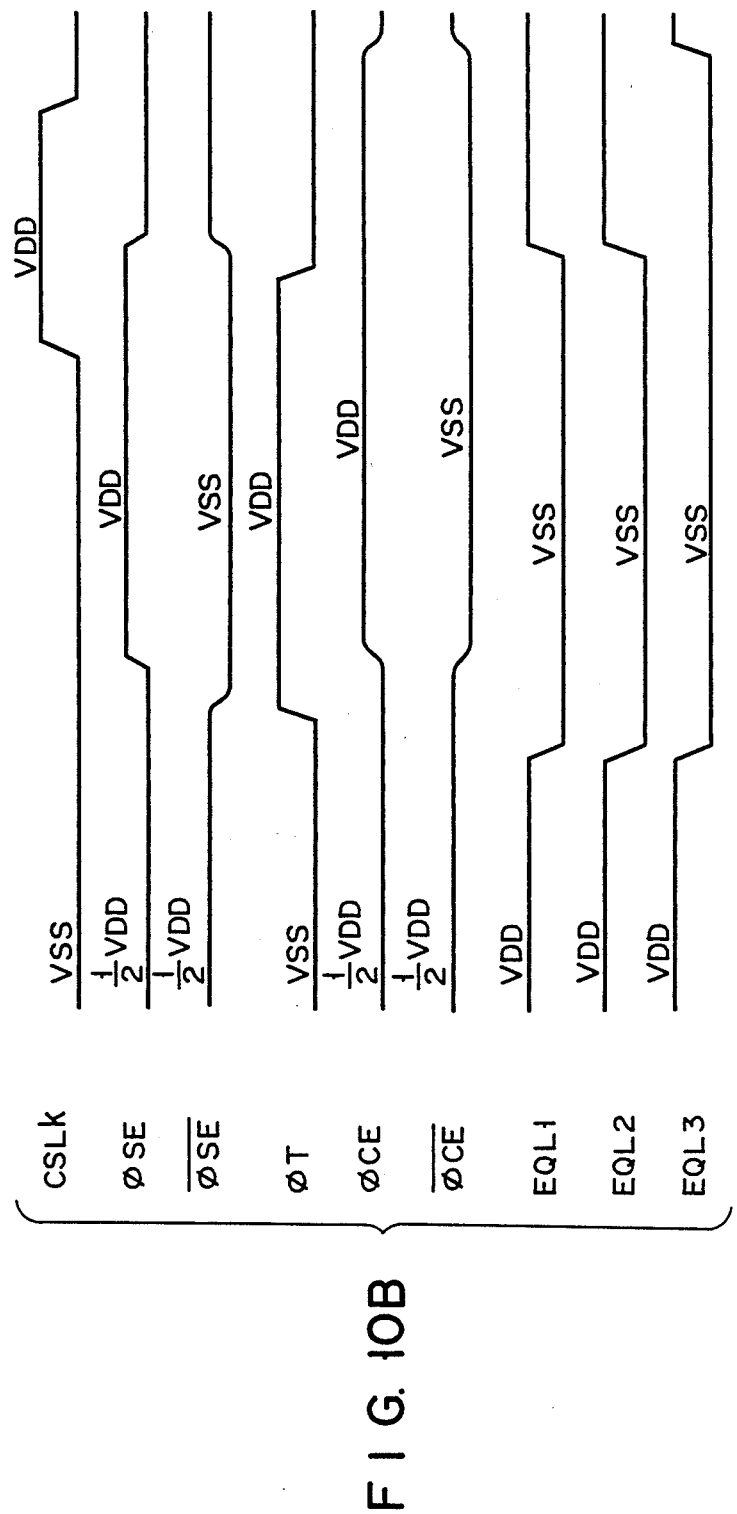
Figure 10C:
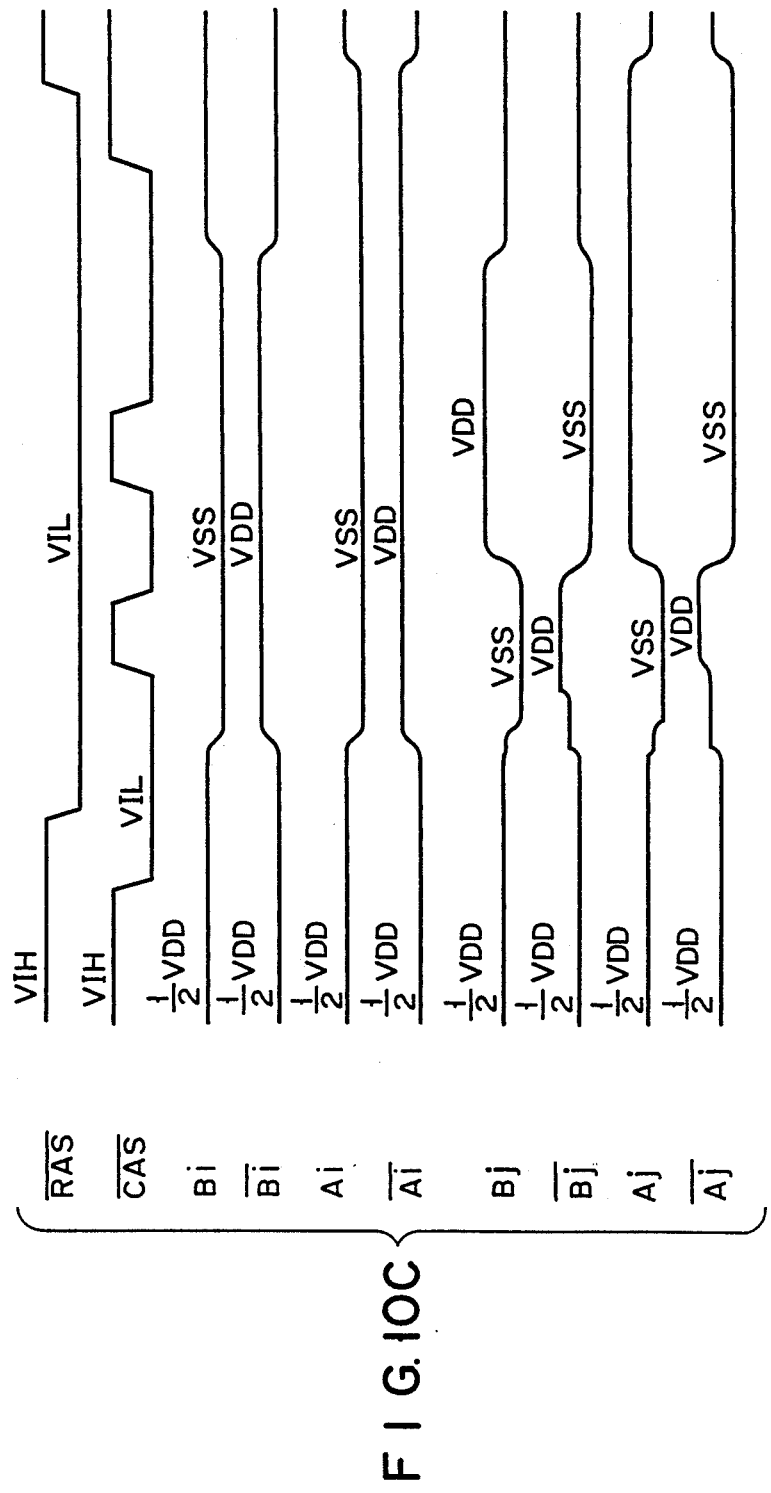
Figure 10D:
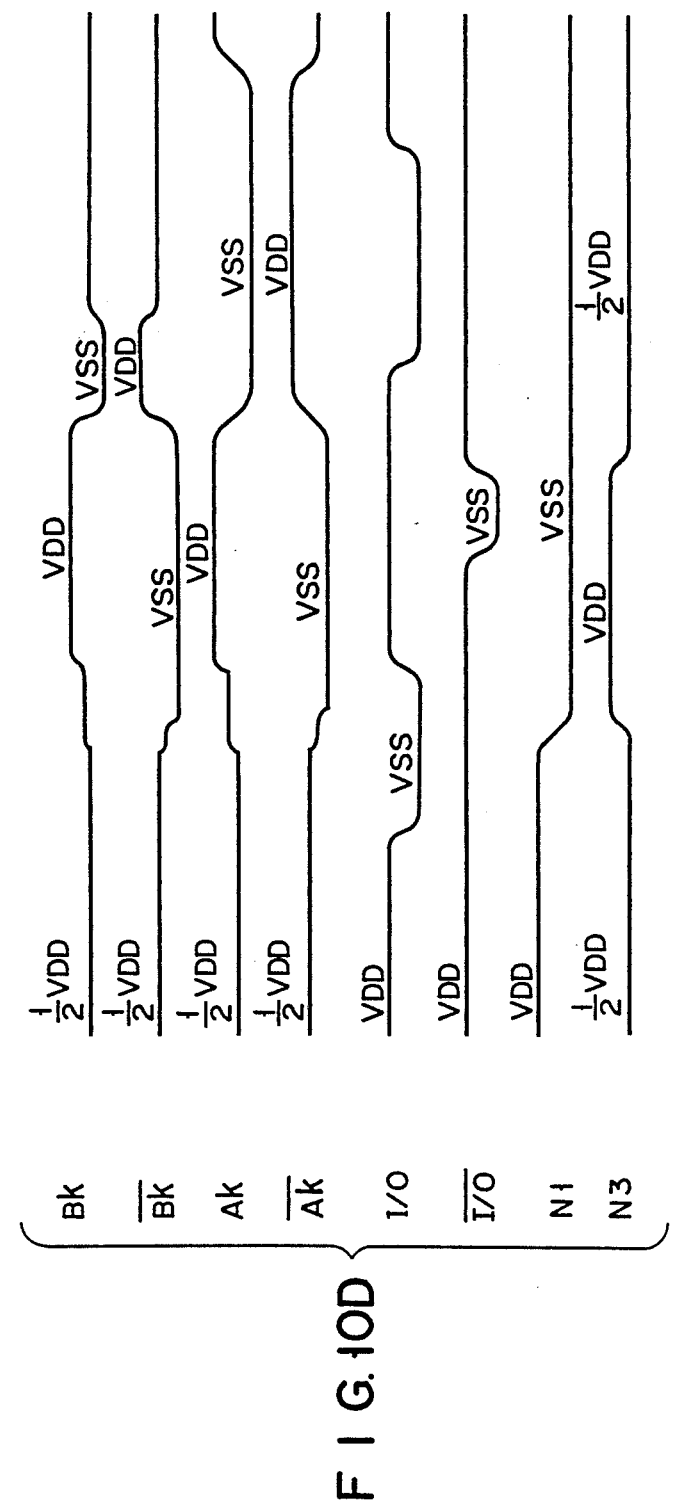

Referring to FIGS. 9A, 9B, and 9C, there are shown timing diagrams of the operation during a read cycle. As in the first embodiment, the operation, in the system where bit lines BL and $\overline{BL}$ are precharged to (½) VDD, to transfer the data in latch memory 20-i onto input/output lines I/O, $\overline{I/O}$ while the bit lines are being precharged is here shown. However, unlike the first embodiment, data is transferred serially.

In the beginning of operation, since equalize signal EQL1 is at the VDD level and bit-line precharging power supply VBL is at the (½) VDD level, all the bit lines BL and $\overline{BL}$ have been precharged to (½) VDD. Assume now that a logic "1" (VDD) is written into storage node N1 of dRAM cell MCi1 associated with i-th bit lines BLi and $\overline{BLi}$ of interest and storage node N3 of dummy cell DCi2 is initially set to (½) VDD by write power supply VDC.

When the $\overline{RAS}$ goes from logic "1" level (VIH) to logic "0" level (VIL), the operation goes into an RAS active mode. As a result, equalize signals EQL1 and EQL2 go from VDD volts down to VSS volts so that bit lines BLi and $\overline{BLi}$ are electrically disconnected from each other, and node N3 of dummy cell DCi2 assumes a floating state.

Subsequently, for example, when word line MW1 is selected and this line and dummy word line are raised to (3/2) VDD level, the stored data in dRAM cell MCi1 and dummy cell DCi2 are read out onto bit lines BLi and $\overline{BLi}$, respectively. Thereafter, equalize signal EQL3 of latch memory cell 20-i decreases from VDD volts to VSS volts.

Subsequently, n-channel transistor activation signal $\phi$SE decreases from (½) VDD volts to VSS volts, and then p-channel transistor activation signal $\overline{\phi SE}$ goes from (½) VDD to VDD. As a result, bit line BLi onto which logic "1" data has been read out is raised to VDD, while bit line $\overline{BLi}$ to which data in dummy cell DCi2 has been read out is lowered to VSS.

Subsequently, control signal $\phi$T goes from VSS to VDD causing first transfer gate 30-i to turn on. When activation signal $\phi$CE goes from (½) VDD to VSS and $\overline{\phi CE}$ goes from (½) VDD to VDD, the contents of bit lines BLi and $\overline{BLi}$ are transferred to nodes Ai and $\overline{Ai}$ of latch memory 20-i.

At a time when the data on bit lines BLi and $\overline{BLi}$ are thus transferred into latch memory cell 20-i, if the write trigger signal $\overline{WE}$ generated outside the dRAM chip is at logic "1" and hence in a read mode, then the bit-line precharge will be initiated automatically. The precharge operation will be described next.

After memory cell MCi1 selected for readout has sufficiently been restored (rewritten), selected word line MWi1 and dummy word line DW2 are lowered in potential from (3/2) VDD to VSS so that MCi1 goes into a nonselected state. Afterward latch memory cell 20-i is electrically disconnected from bit lines BLi and $\overline{BLi}$.

Bit-line equalize signal EQL1 goes from VSS to VDD causing equalizer 10-i to to precharge the bit lines. In this case, when $\overline{CAS}$ clock goes from logic "1" to logic "0", if the i-th column is selected, column select signal CSLi is raised in level from VSS to VDD or (3/2) VDD causing second transfer gate 40-i to turn on and nodes Ai and $\overline{Ai}$ of latch memory cell 20-i to be electrically connected to input/output lines I/O and $\overline{I/O}$. When the i-th column is selected, I/O remains at VDD, $\overline{I/O}$ is lowered from VDD to VSS, and the output terminal Dout goes from high-impedance level (Hiz) to logic "1" level (VOH). The operation described so far is the same as that of the first embodiment.

Subsequently, when $\overline{RAS}$ is in the logic "0" state and $\overline{CAS}$ goes from logic "0" back to logic "1", the data at output terminal Dout is reset to Hiz. The data of sense amplifier 10-i is also reset and $\overline{I/O}$, which has been lowered to VSS, is also precharged to the VDD level like I/O. A column address buffer and a column decoder are also reset, and column select signal CSLi goes from VDD to VSS.

Afterward, when the j-th column address is entered and $\overline{CAS}$ again goes from logic "1" to logic "0", the j-th column select line CSLj is selected. The content in the j-th latch memory cell, which is logic "0" now, is read out so that the output terminal Dout goes from Hiz to logic "0" (VOL).

Moreover, $\overline{CAS}$ is set from logic "0" to logic "1" to perform CAS precharging, and then the k-th column address is entered to render CAS active with the result that the data in the k-th latch memory cell, in this case logic "1", is read out.

When $\overline{RAS}$ is raised from logic "0" to logic "1" and $\overline{CAS}$ is subsequently raised from logic "0" to logic "1", equalize signal EQL3 goes from VSS to VDD, resetting data in all the latch memory cells 20.

As is evident from the foregoing, according to the second embodiment, during the read cycle, by temporally storing data read from a memory cell in the latch memory cell and by toggling the $\overline{CAS}$, the serial access can be performed while the bit lines are precharged during the RAS active period.

The write-cycle operation will be described with reference to timing charts of FIGS. 10A, 10B, 10C, and 10D. Unlike the read cycle, during the write cycle, the $\overline{CAS}$ goes from logic "1" to logic "0" prior to the $\overline{RAS}$. At the same time, the $\overline{WE}$ also goes to logic "0". As a result, a column address is first entered in the dRAM chip. For example, where the i-th column is selected, the column select signal CSLi does not rise at this time, but the column address is latched into the column decoder for selecting a column select line. The writing circuitry operates to activate a sense amplifier associated with the input/output lines I/O and $\overline{I/O}$. In this case the I/O goes from VDD to VSS, while the $\overline{I/O}$ remains at VDD.

Subsequently, when the $\overline{RAS}$ clock goes from logic "1" to logic "0", the equalize signals EQL1, EQL2 and EQL3 go from VDD down to VSS with the result that the bit lines BLi, $\overline{BLi}$ and the nodes Ai, $\overline{Ai}$ of the latch memory cell go into the floating state.

When the level of word line MWi1 and dummy word line DWi2 is raised from VSS to (3/2) VDD by the entered row address, column select signal CSLi is raised from VSS to VDD by the column address which has already been latched into the column decoder and the control signal $\phi T$ also goes from VSS to VDD. Consequently, first and second transfer gates 30 and 40 are turned on, and bit lines BLi and $\overline{BLi}$ are thus electrically connected to input/output lines I/O and $\overline{I/O}$, respectively, so that bit line $\overline{BLi}$ is lowered from ($\frac{1}{2}$) VDD to VSS and bit line BLi is raised from ($\frac{1}{2}$) VDD to VDD.

Subsequently, the n-channel transistor activation signal $\overline{\phi SE}$ for bit-line sense amplifier 10-i and the activation signal $\overline{\phi CE}$ for the latch memory cell go from ($\frac{1}{2}$) VDD to VSS, and then the p-channel transistor activation signal $\phi SE$ and the latch-memory activation signal $\phi CE$ go from ($\frac{1}{2}$) VDD to VDD. As a result, writing data into the selected memory cell and rewriting data into non-selected memory cells are initiated. That is, since node N1 of the selected dRAM cell MCi1 and node N3 of dummy memory cell DCi2 are electrically connected to bit lines BLi and $\overline{BLi}$, respectively, node N1 goes from VDD to VSS so that logic "0" is written into it, and node N3 goes from ($\frac{1}{2}$) VDD to VDD.

Next, when $\overline{RAS}$ and $\overline{WE}$ are in the "0" state, the CAS goes from logic "0" to logic "1", resetting output terminal Dout and the sense amplifier. Like the $\overline{I/O}$, the I/O, which has been lowered to VSS, is also precharged to VDD. At the same time, the column address buffer and column decoder are also reset, and the column select signal CSLi goes from VDD to VSS.

Afterward, when the j-th column address is entered and the $\overline{CAS}$ goes from logic "1" to logic "0" again, the j-th column select line CSLj is selected. At the same time, data is output to output terminal Dout and, if input data is logic "1", then the "1" data is written into a selected memory cell of the j-th column.

Moreover, like the above, by causing the $\overline{CAS}$ to go from logic "0" to logic "1" to perform the CAS precharge, the column address buffer, column decoder output terminal Dout and sense amplifier are reset.

When the k-th column address is entered and the $\overline{CAS}$ goes from logic "1" to logic "0" to start the CAS active period, "0" data is written into a selected memory in the k-th column. Then, when $\overline{WE}$ goes from logic "0" to logic "1" while the $\overline{RAS}$ and $\overline{CAS}$ are at logic "0", word line MW1 and dummy word line DW2 are lowered from (3/2) VDD to VSS, resulting in the non-selected state. At almost the same time, control signal $\phi T$ is also lowered from VDD to VSS so that first transfer gate 30-i is turned off and thus the latch memory cell is electrically disconnected from the bit lines. The bit-line equalize signal EQL1 then goes from VSS to VDD, initiating the precharging of the bit lines. At the same time, equalize signal EQL2 goes from VSS to VDD, writing the initial set level of ($\frac{1}{2}$) VDD into the dummy cell.

By the $\overline{WE}$ being changed from logic "0" to logic "1", the write circuitry is disabled and instead the read circuitry is enabled so that data in the k-th latch memory cell is read out from output terminal Dout. In the present case, since the logic "0" has been written, logic "0" is output.

As described above, according to the second embodiment utilizing the arrangement in which a latch memory cell is provided for each bit line, the $\overline{CAS}$ is activated prior to the $\overline{RAS}$ in the write cycle so that a column address may be entered into the dRAM chip prior to a row address, while $\overline{RAS}$ is activated prior to the $\overline{CAS}$ in the read cycle so that a row address may be entered into the dRAM chip prior to a column address. Thus, the bit lines are precharged during the RAS active period in the read cycle. In the write cycle, the bit lines can be precharged immediately after the write trigger signal $\overline{WE}$ goes from logic "0" to logic "1" to complete the write cycle.

Moreover, the serial access can be performed by toggling the $\overline{CAS}$ in either of the write cycle and the read cycle.

That is to say, since the bit lines can be precharged during the RAS active period, not during the RAS precharge period as in the prior art, the cycle time can be reduced significantly as compared to the prior art.

A third embodiment of the present invention will be described hereinafter. The circuit arrangement of this embodiment is the same as that of the first embodiment shown in FIGS. 1 and 2 and thus the description thereof is considered unnecessary.

Figure 11B:
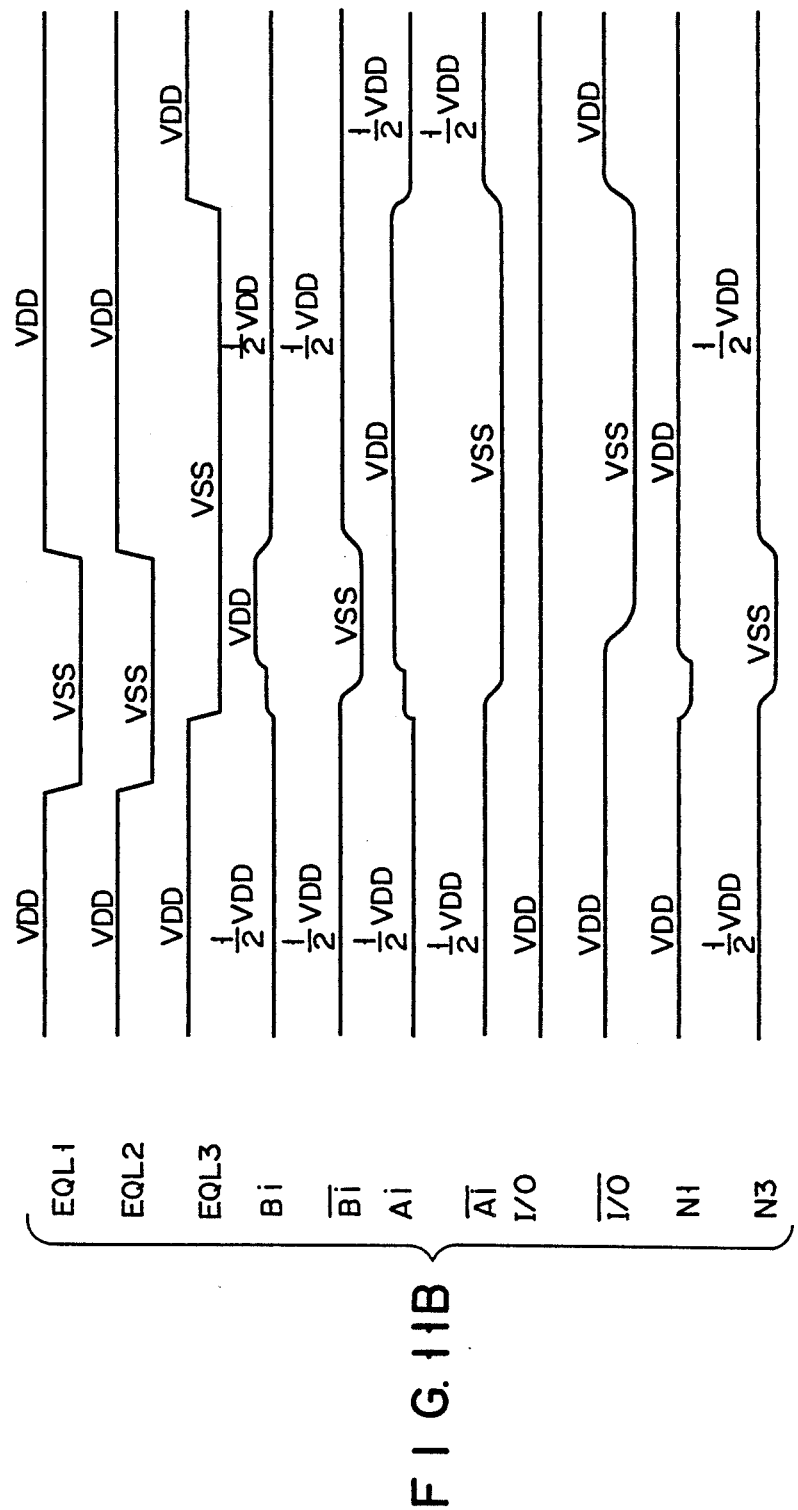

The operation in the read cycle of the third embodiment will be described with reference to FIGS. 11A and 11B. FIGS. 11A and 11B also show signal waveforms in performing an operation to transfer data in latch memory 20-i onto the input/output lines in the system where the bit lines are precharged to ($\frac{1}{2}$) VDD.

In the beginning of operation, since bit-line equalize signal EQL1 is at the VDD level and bit-line precharging power supply VBL is at the ($\frac{1}{2}$) VDD level, all the bit lines BL and $\overline{BL}$ have been precharged to ($\frac{1}{2}$) VDD.

Assume now that a logic "1" (VDD) is written into storage node N1 of dRAM cell MCi1 associated with i-th bit lines BLi and $\overline{BLi}$ of interest and storage node N3 of dummy cell DCi2 is initially set to ($\frac{1}{2}$) VDD by write power supply VDC.

When the $\overline{CAS}$ goes from logic "1" (VIH) to logic "0" (VIL) prior to the $\overline{RAS}$, a column address is first entered into the chip. Where, for example, the i-th column is selected, although column select line CSLi does not rise from VSS to VDD at this time, the i-th column address is latched into a decoder (not shown) for column select lines.

Subsequently, when the $\overline{RAS}$ goes from logic "1" to logic "0", equalize signals EQL1 and EQL2 are lowered from VDD to VSS so that word line MW1 is selected and this line and dummy word line DW2 are raised to (3/2) VDD. As a result, the contents of dRAM cell MCi1 and dummy cell DCi2 are read out onto bit lines BLi and $\overline{BLi}$, respectively. In addition, equalize signal EQL3 of latch memory cell 20-i is lowered from VDD to VSS.

The n-channel transistor activation signal $\overline{\phi SE}$ of bit-line sense amplifier 10-i subsequently decreases from ($\frac{1}{2}$) VDD to VSS, and then p-channel transistor activation signal $\phi SE$ goes from ($\frac{1}{2}$) VDD to VSS. As a result, bit line BLi onto which the logic "1" data of memory cell MCi1 has been read out is raised to VDD, while bit line $\overline{BLi}$ to which the data in dummy cell DCi2 has been read out is lowered to VSS.

Control signal $\phi T$ subsequently goes from VSS to VDD causing first transfer gate 30 to be turned on. When activation signal $\overline{\phi CE}$ goes from ($\frac{1}{2}$) VDD to VSS and $\phi CE$ goes from ($\frac{1}{2}$) VDD to VDD, the contents of bit lines BLi and $\overline{BLi}$ are transferred to nodes Ai and $\overline{Ai}$ of latch memory 20-i, respectively.

By the column address latched by the decoder for column select lines, column select line CSLi is raised from VSS to VDD so that nodes Ai and $\overline{Ai}$ are electrically connected to input/output lines I/O and $\overline{I/O}$, respectively. In the present case, the I/O remains at VDD and $\overline{I/O}$ is lowered from VDD to VSS so that output terminal Vout goes from Hiz to VOH (high level). At the same time, control signal $\phi T$ goes from VDD to VSS, turning transfer gate 30-i off. After latch memory cell 20-i is thus electrically disconnected from bit lines BLi and $\overline{BLi}$, word line MW1 and dummy word line DW2 go from (3/2) VDD to VSS and bit-line equalize signal EQL1 goes from VSS to VDD, precharging the bit lines.

As is evident from the foregoing, in the dRAM of this embodiment also, by temporally storing data read from a memory cell in the latch memory cell associated with the bit lines, the bit lines can be precharged during the RAS active period as well.

Figure 12A:
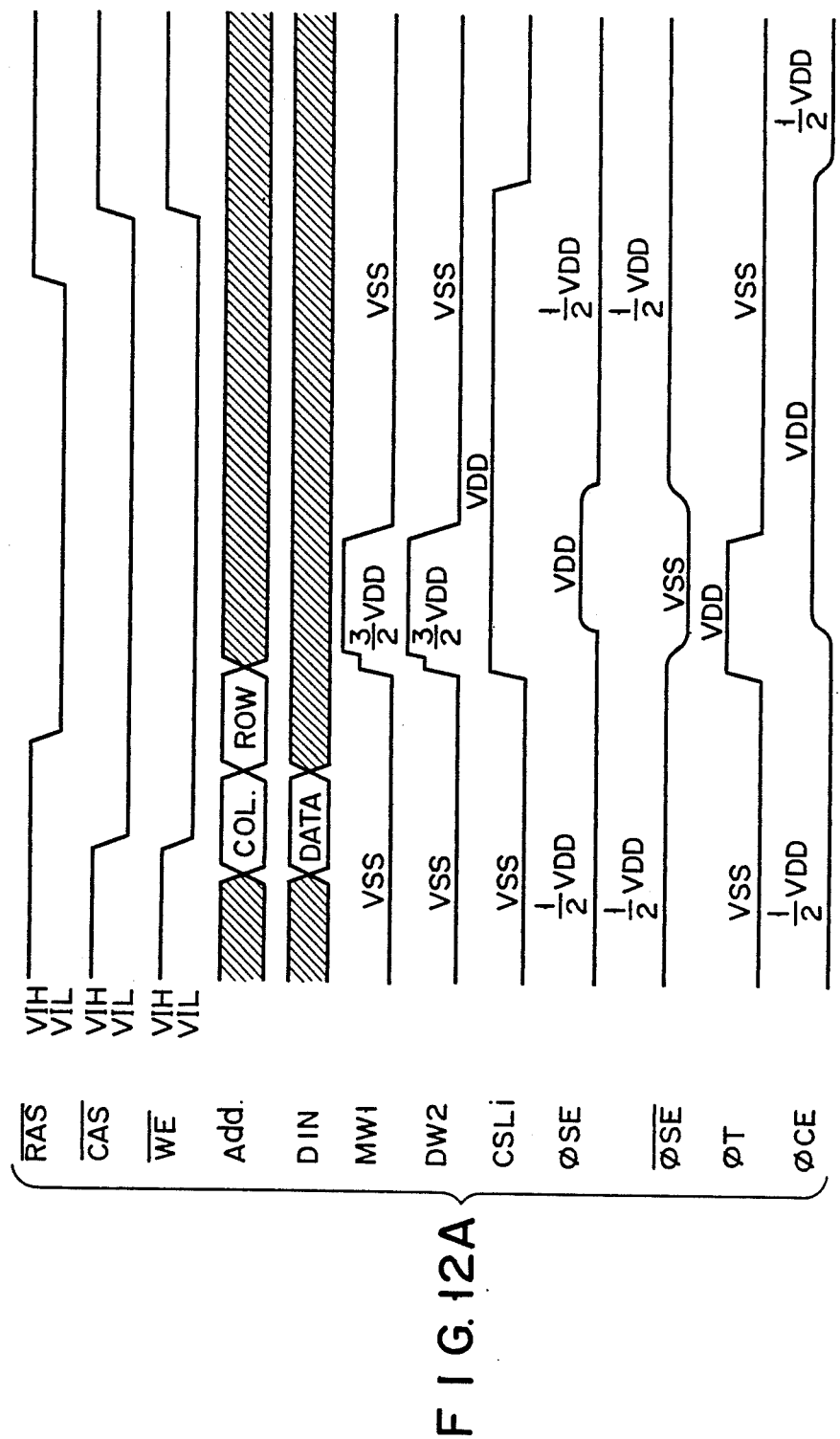
FIGS. 12A and 12B show waveforms of signals indicating the operation in a write cycle of the third embodiment.
Figure 12B:
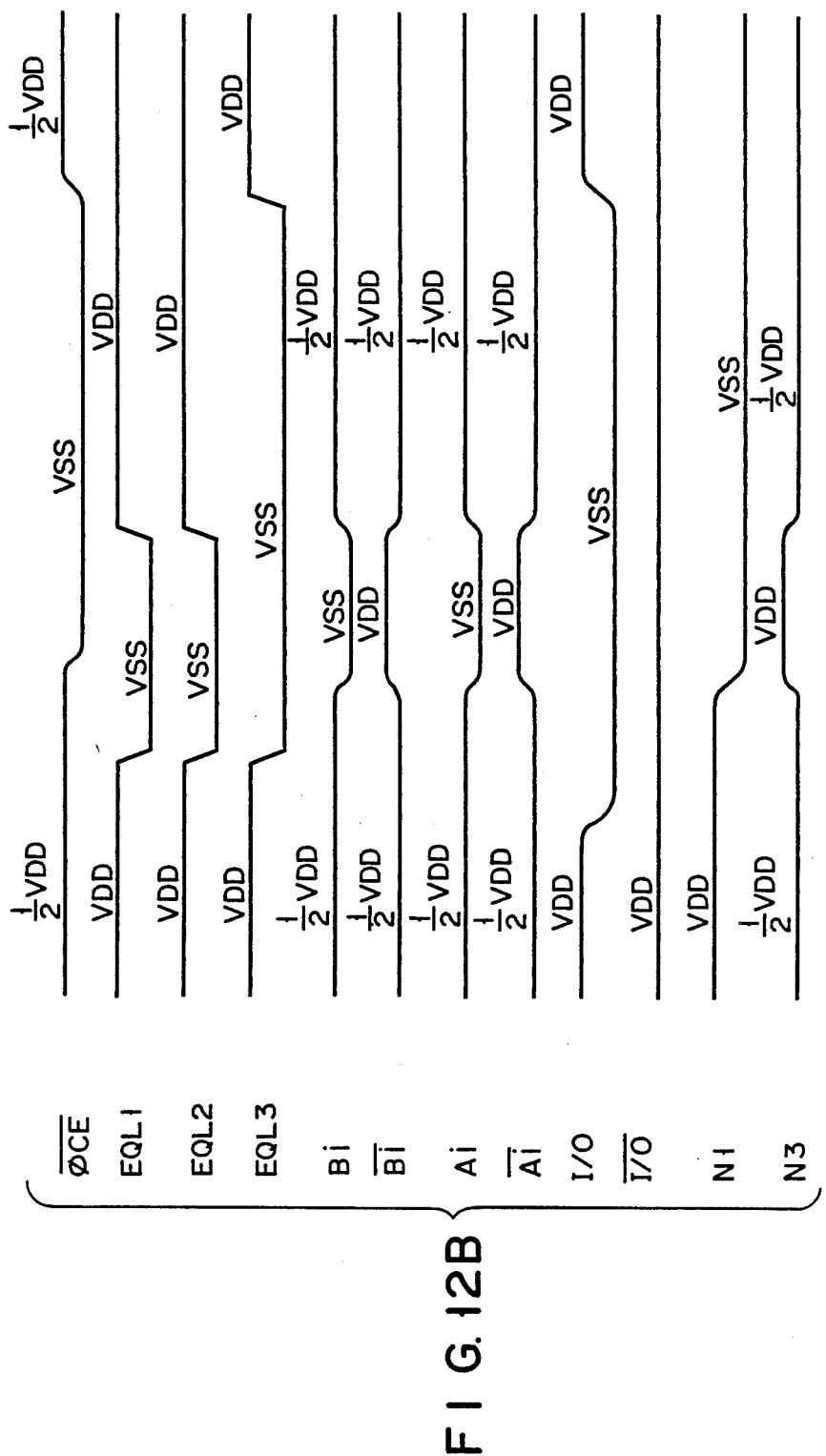

FIGS. 12A and 12B show signal waveforms for explaining the operation of the write cycle. As in the read cycle, in the write cycle as well, the $\overline{CAS}$ goes from logic "1" to logic "0" prior to the $\overline{RAS}$ and thus the i-th column address is latched into the decoder for column select lines.

When the write trigger signal $\overline{WE}$ goes from "1" to "0", the write circuitry is enabled so that a data input buffer operates to activate the sense amplifier associated with the input/output lines I/O and $\overline{I/O}$. For example, if input data is "0", then the I/O goes from VDD to VSS and the $\overline{I/O}$ remains at VDD.

When the $\overline{RAS}$ then goes from "1" to "0", equalize signals EQL1~EQL3 go from VDD to VSS so that bit lines BLi and $\overline{BLi}$ and nodes Ai and $\overline{Ai}$ of the latch memory cell go into the floating state. The level of word line MW1 and dummy word line DW2 is raised from VSS to (3/2) VDD by the input row address. At the same time, column select line CSLi is raised from VSS to VDD by the column address which has already been latched by the column decoder, and control signal $\phi T$ also goes from VSS to VDD. As a result, first and second transfer gates 30-i, 40-i are turned on so that bit lines BLi and $\overline{BLi}$ are electrically connected to input/output lines I/O and $\overline{I/O}$, respectively. The $\overline{BLi}$ goes from ($\frac{1}{2}$) VDD to VSS, while the BLi goes from ($\frac{1}{2}$) VDD to VDD.

Next, n-channel transistor activation signal $\overline{\phi SE}$ for the sense amplifier and latch-memory activation signal $\overline{\phi CE}$ simultaneously go from ($\frac{1}{2}$) VDD to VSS, while p-channel transistor activation signal $\phi SE$ an latch-memory activation signal $\phi CE$ simultaneously go from ($\frac{1}{2}$) VDD to VDD. Consequently, writing of data into a selected memory cell and rewriting of nonselected memory cells are initiated. That is, since node N1 of the selected dRAM cell MCi1 and node N2 of dummy memory cell DCi2 are connected to bit lines BLi and $\overline{BLi}$, respectively, node N1 goes from VDD to VSS so that logic "0" is written into, and node N2 goes from ($\frac{1}{2}$) VDD to VDD.

After nonselected memory cells have sufficiently been rewritten, word line MW1 and dummy word line DW2 go from (3/2) VDD to VSS. At substantially the same time, control signal $\phi T$ also goes from VDD to VSS and thus transfer gate 30-i turns off, thereby electrically disconnecting the latch memory from the bit lines. Bit-line equalize signal EQL1 goes from VSS to VDD so that the precharging of the bit lines is initiated. At the same time, equalize signal EQL2 goes from VSS to VDD so that the initial set level of ($\frac{1}{2}$) VDD is written into the dummy cell.

In that way, during the read cycle, since data to be written into is latched into the latch memory cell a little early, the timing of the subsequent precharging of the bit lines can also be quickened.

As described above, according to the third embodiment in which a latch memory cell is provided for each bit line, the $\overline{CAS}$ is activated prior to the $\overline{RAS}$ and a column address is loaded into the dRAM chip prior to a row address in both the write cycle and the read cycle. Hence, in the read cycle, the bit lines can be precharged while the read data is output from the latch memory. In other words, the precharging of the bit lines, which was conventionally performed during the RAS precharging period, can be performed during the RAS active period. During the write cycle, a column select line is selected simultaneously with the selection of a word line, permitting quick writing of data. Immediately after the completion of the write cycle, the bit lines are precharged. As a result of the above, the cycle time can significantly be reduced as compared with the prior art.

Figure 13:
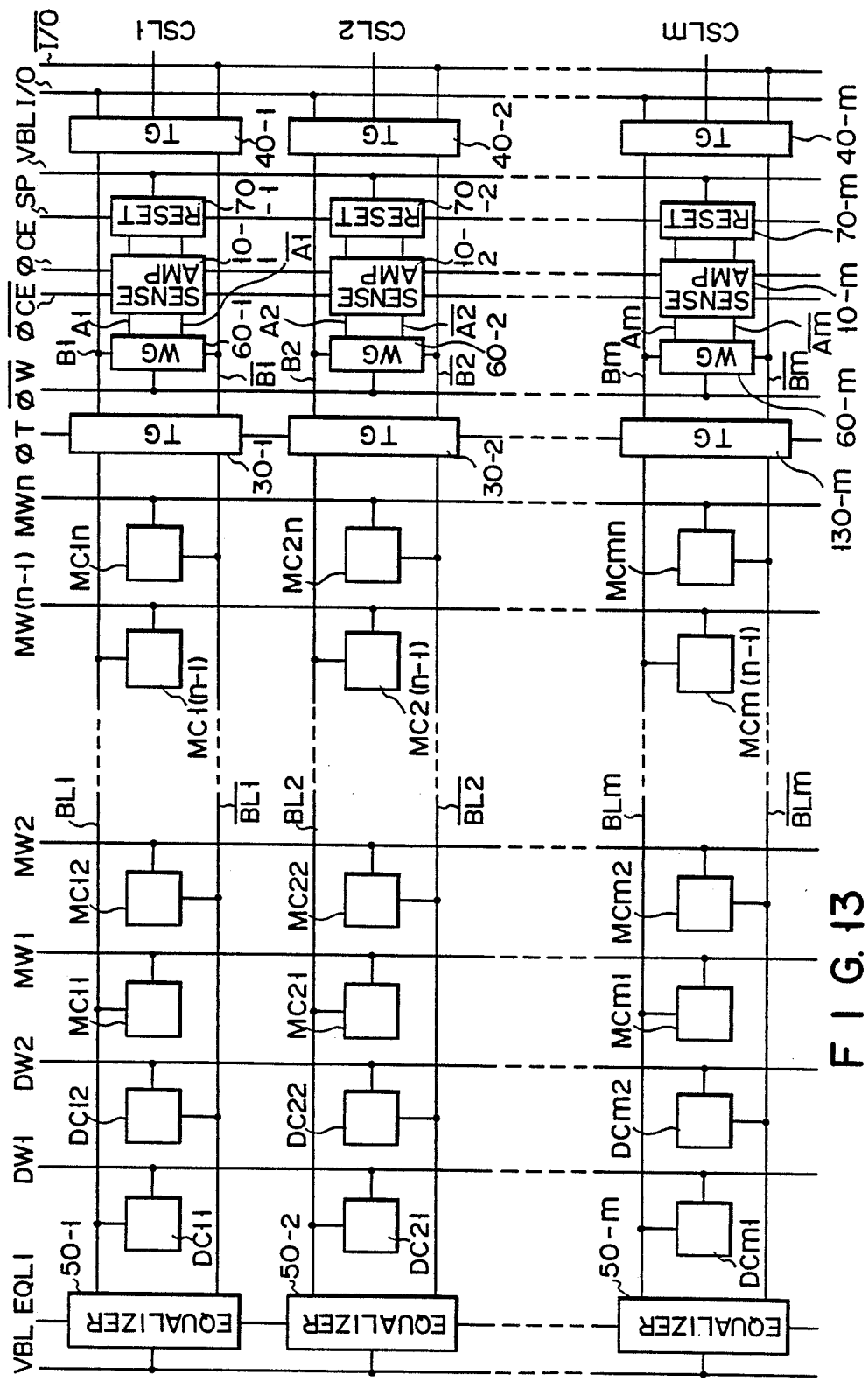
FIG. 13 is a block diagram of a semiconductor memory according to a fourth embodiment of the present invention.

FIG. 13 shows an arrangement of the dRAM of the fourth embodiment of the present invention. The descriptions of the same portions as those of the first embodiment shown in FIG. 1 are omitted. In the fourth embodiment, latch memory cell 20-i in the first embodiment is excluded and first transfer gate 30-i connected to bit lines BLi and $\overline{BLi}$ is connected to a latch-type bit-line sense amplifier 10-i via a write transfer gate 60-i. That is, the bit-line sense amplifier serves as the latch memory cell as well. Nodes Bi and $\overline{Bi}$ between first transfer gate 30-i and write transfer gate 60-i serve as write nodes which are connected to input/output lines I/O and $\overline{I/O}$, respectively, via second transfer gate 40-i controlled by column select line CSLi. Reset circuit 70-i is connected to latch-type bit-line sense amplifier 10-i.

Figure 14:
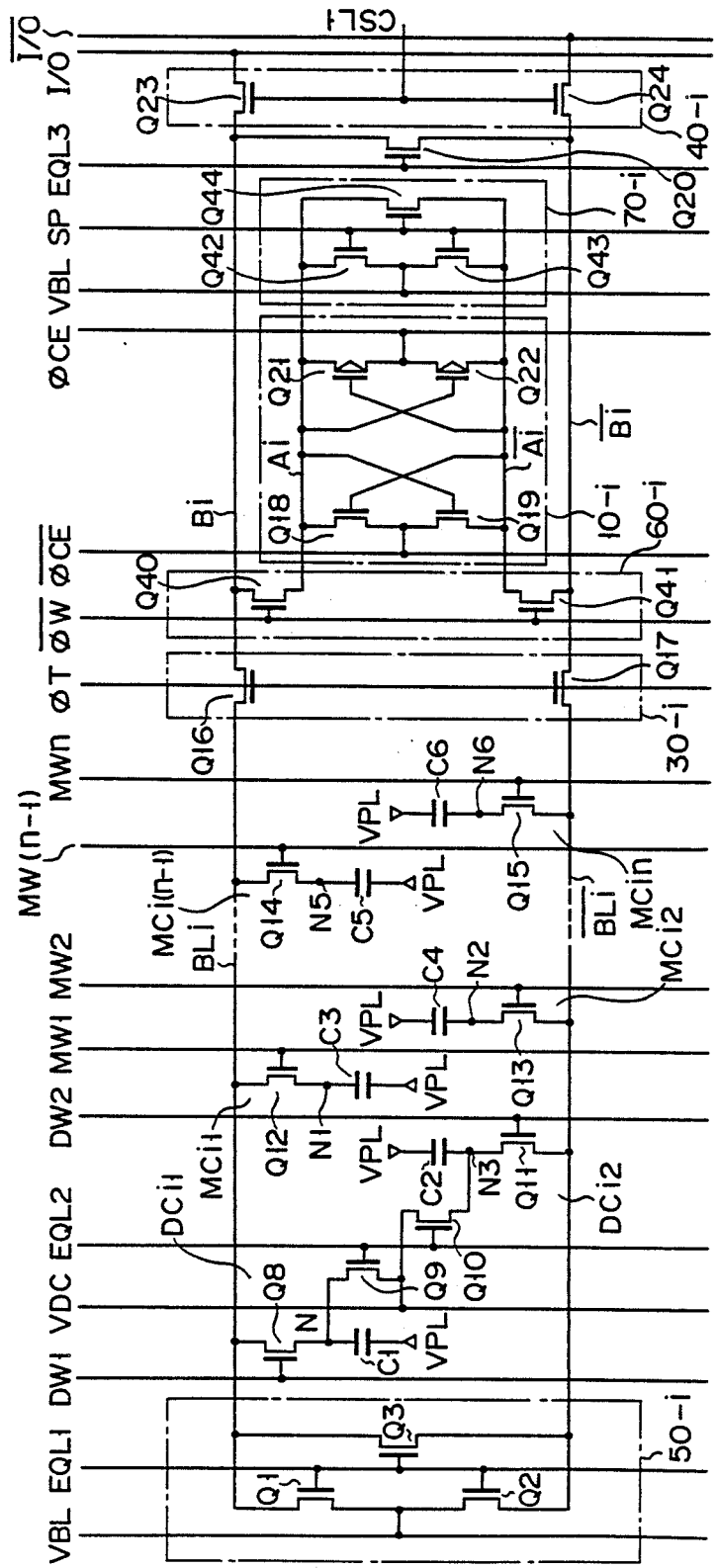
FIG. 14 is a circuit diagram of a portion of the fourth embodiment.

FIG. 14 shows a specific circuit arrangement for one row of the dRAM of FIG. 13.

Bit-line sense amplifier 10-i is comprised of a flip-flop consisting of a pair of n-channel MOS transistors Q18 and Q19 and a flip-flop consisting of a pair of p-channel MOS transistors Q21 and Q22. The sources of paired transistors Q18, Q19 are connected to receive activation signal $\overline{\phi CE}$, while the source of paired transistors Q21, Q22 are connected to receive activation signal $\phi CE$. Equalizing n-channel MOS transistor Q20 of sense amplifier 10-i in the first embodiment is provided to precede second transfer gate 40-i.

Write transfer gate 60-i between nodes Ai, $\overline{Ai}$ of sense amplifier 10-i and write nodes Bi, $\overline{Bi}$ is formed of n-channel MOS transistors Q40, Q41.

A reset circuit 70-i for the sense amplifier 10-i is comprised of two n-channel MOS transistors Q42, Q43 having their drains connected together to bit-line precharge power supply VBL and their sources connected to bit lines BLi, $\overline{BLi}$, respectively, and an n-channel MOS transistor Q44 having its source and drain connected to bit lines BLi and $\overline{BLi}$, respectively. A reset signal SP is applied to the gates of transistors Q42, Q43, and Q44.

Figure 15B:
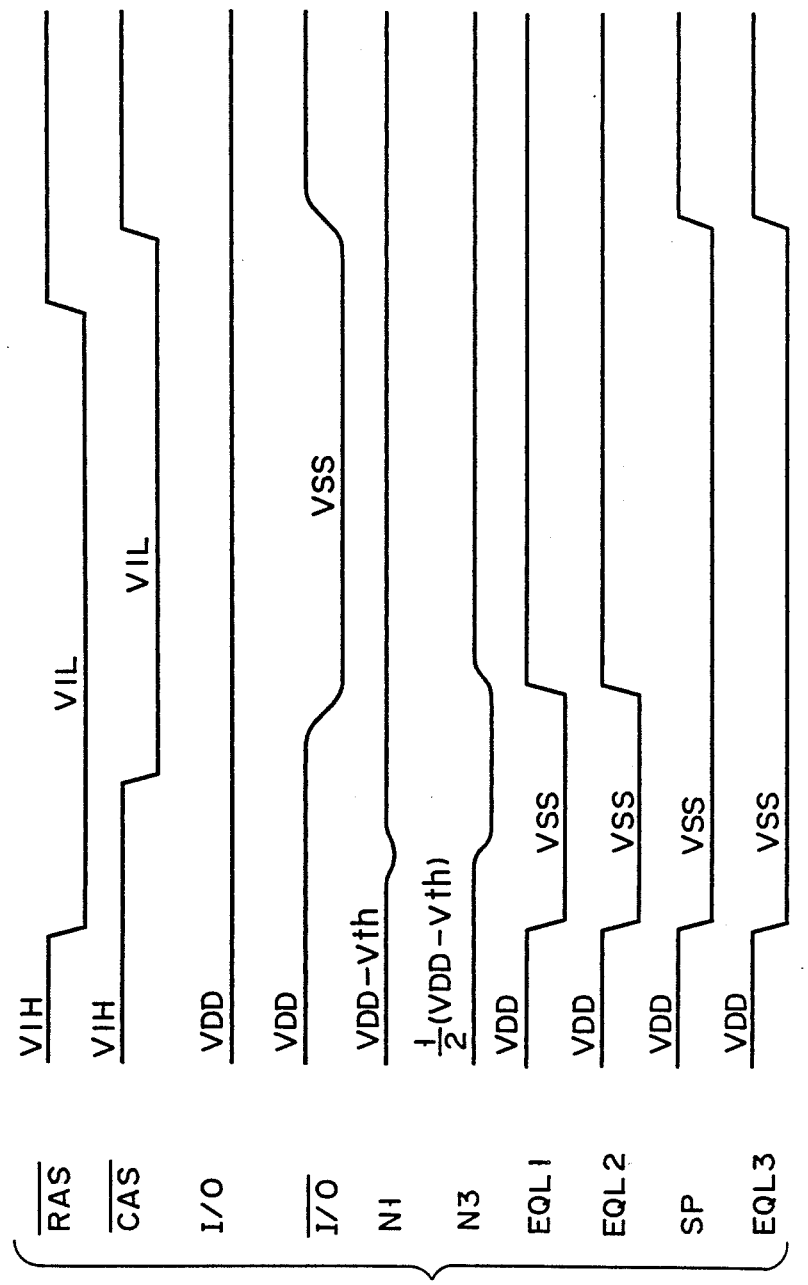

FIGS. 15A and 15B show signal waveforms used for explaining the operation in a read cycle of the dRAM of the fourth embodiment. In this embodiment also, the bit lines are precharged to ($\frac{1}{2}$) VDD. Further, after stored data in a memory cell is transferred to bit-line sense amplifier 10-i, sense amplifier 10-i is electrically disconnected from the bit lines, and data latched into the sense amplifier is transferred to the input/output lines for readout while the bit lines are being precharged. The read operation will be detailed hereinafter.

At first since bit-line equalize signal EQL1 is at VDD and bit-line precharging power supply VBL is at ($\frac{1}{2}$) VDD, all the bit lines have been precharged to ($\frac{1}{2}$) VDD. Assume now that VDD or VDD−Vth (logic "1") is written into capacitor node N1 of memory cell MCi1 associated with the i-th bit-line pair of interest. Capacitor node N3 of dummy cell DCi2 is initially set to ($\frac{1}{2}$) VDD or ($\frac{1}{2}$) (VDD−Vth).

When $\overline{RAS}$ goes from logic "1" (VIH) to logic "0" (VIL) prior to $\overline{CAS}$ so that the operation goes into the RAS active period, signals EQL1, EQL2, SP, EQL3 go from VDD to VSS and the level of word line MW1 and dummy word line DM2 is raised from VSS to (3/2) VDD or VDD. As a result, the contents of memory cell MCi1 and dummy cell DCi2 are read out onto bit lines BLi and $\overline{BLi}$, respectively. At the same time control signal $\phi$T for first transfer gate 30-i also goes from VSS to VDD or (3/2) VDD. Since control signal $\phi$W for write transfer gate 60-i remains at VDD or (3/2) VDD, data on bit lines BLi and $\overline{BLi}$ are transferred to nodes Ai and $\overline{Ai}$ via write nodes Bi and $\overline{Bi}$.

Subsequently n-channel transistor activation signal $\overline{\phi CE}$ goes from ($\frac{1}{2}$) VDD to VSS, and then p-channel transistor activation signal $\phi$CE goes from ($\frac{1}{2}$) VDD to VSS. As a result, bit line BLi onto which logic data "1" has been read out from memory cell MCi1 is raised to VDD, while bit line $\overline{BLi}$ associated with dummy cell DCi2 is lowered to VSS.

After the memory cell associated with selected word line MW1 has sufficiently been rewritten into, word line MW1 and dummy word line DW2 are lowered from (3/2) VDD or VDD to VSS so that the cells go into the nonselected state. At the same time since control signal $\phi$T is lowered to VSS, first transfer gate 30-i is also turned off so that sense amplifier 10-i is electrically disconnected from bit lines BLi and $\overline{BLi}$. Then bit-line equalize signal EQL1 and dummy-cell equalize signal EQL2 go from VSS to VDD, beginning equalizing and precharging BLi, $\overline{BLi}$ and dummy cells DCi1, DCi2. The sequence of operations of selecting a word line, transferring data to the sense amplifier and latching the data therein, resetting the word line, electrically disconnecting the bit-line sense amplifier and precharging the bit lines is automatically performed by $\overline{RAS}$ going from logic "1" to logic "0".

Independently of the series of operations performed so far, $\overline{CAS}$ goes from logic "1" to "0" so that a column address is loaded and thus data is transferred between the bit-line sense amplifier and the input/output lines in a selected column. That is, assuming now that the i-th column is selected, column select line CSLi goes from VSS to VDD or (3/2) VDD with the result that second transfer gate 40-i is turned on and write nodes Bi and $\overline{Bi}$ are electrically connected to input/output lines I/O and $\overline{I/O}$. In this example, I/O remains at VDD, and I/O goes from VDD to VSS, causing output terminal Dout to go from Hiz to logic "1" (VOH).

Afterward, when $\overline{RAS}$ goes from logic "0" to logic "1" and $\overline{CAS}$ also subsequently goes from logic "0" to "1", reset signal SP for the bit-line sense amplifier and equalize signal EQL3 for the sense amplifier go from VSS to VDD, activation signals $\phi$CE and $\overline{\phi CE}$ for the bit-line sense amplifier return to ($\frac{1}{2}$) VDD, and the bit-line sense amplifiers are all reset. Further, column select line CSLi also goes from VDD or (3/2) VDD to VSS, input/output lines I/O and $\overline{I/O}$ return to VDD after being precharged, and output terminal Dout is reset to the Hiz level.

FIGS. 16A and 16B show signal waveforms used for explaining the operation of a write cycle of the dRAM of the present embodiment. During the write cycle, $\overline{CAS}$ goes from logic "1" to logic "0" prior to $\overline{RAS}$, and at the same time write trigger signal $\overline{WE}$ also becomes logic "0". Consequently, a column address is first loaded into the dRAM chip. At the same time, bit-line equalize signal EQL1 goes from VDD to VSS so that the bit line pair goes into the floating state. At the same time dummy-cell equalize signal EQL2 and sense-amplifier equalize signal EQL3 also go from VDD to VSS.

If, for example, the i-th column is selected by the column address, then column address CSLi goes from VSS to VDD or (3/2) VDD, turning second transfer gate 40-i on. At the same time first transfer gate 30-i is also turned on by the rise of control signal $\phi$T. Write transfer gate 60-i is turned off by control signal $\overline{\phi T}$ going from VDD or (3/2) VDD to VSS with the result that bit-line sense amplifier 10-i is electrically disconnected from bit lines BLi and $\overline{BLi}$. At the same time the write circuitry operates, and if write input data is "0", the data input buffer is enabled to activate sense amplifier 10-i. In this case, I/O goes from VDD to VSS, while $\overline{I/O}$ immediately returns to VDD after being slightly lowered because electrons flow into the bit line BLi.

In this way the input data is transferred from input/output lines I/O and $\overline{I/O}$ to bit lines BLi and $\overline{BLi}$ via first and second transfer gates 30-i and 40-i. Bit line BLi goes from ($\frac{1}{2}$) VDD to VSS, while bit line $\overline{BLi}$ goes ($\frac{1}{2}$) VDD to VDD or VDD−Vth.

Thereafter, when $\overline{RAS}$ goes "1" to "0", the row address buffer operates so that a row address is loaded. Assuming now that the first word line is selected by the row address, word line MW1 and dummy word line DW2 go in level from VSS to (3/2) VDD or VDD. Subsequently reset signal SP for the bit-line sense amplifier goes from VDD to VSS, and control signal $\overline{\phi W}$ for write transfer gate 60-i goes from VSS to VDD or (3/2) VDD.

When n-channel transistor activation signal $\overline{\phi CE}$ goes from ($\frac{1}{2}$) VDD to VSS, and p-channel transistor activation signal $\phi$CE subsequently goes from ($\frac{1}{2}$) VDD to VDD, nonselected bit lines BLh and $\overline{BLh}$ go from ($\frac{1}{2}$) VDD to VDD−Vth (or VDD) and VSS, respectively, according to data from the memory cell and dummy cell.

After the memory cell connected to selected word line MW1 is then sufficiently rewritten into, word line MW1 and dummy word line DW2 go from (3/2) VDD to VSS so that they go into the nonselected state. Bit-line equalize signal EQL1 and dummy-cell equalize signal EQL2 go from VSS to VDD initiating the equalizing and precharging of the bit lines.

Thereafter, write trigger signal $\overline{WE}$, $\overline{RAS}$ and $\overline{CAS}$ go from logic "0" to logic "1", resetting column select line CSLi, input/output lines I/O and $\overline{I/O}$, write nodes Bi and $\overline{Bi}$ and bit-line sense amplifier 10-i.

In FIGS. 15 and 16, control signal $\phi$T for first transfer gate 30-i and control signal $\overline{\phi W}$ are shown with VDD as their "H" level. If their "H" level is chosen to be (3/2) VDD, bit lines BLi and $\overline{BLi}$ go to VDD, VSS. Thus, the "1" write level for memory cells is not VDD−Vth, but VDD. Further, if only up to VDD−Vth is written into a memory cell, the word line need not be raised and VDD may be used as the "H" level.

As described above, according to the fourth embodiment, a latch-type sense amplifier is provided for each bit line, a write transfer gate is provided between write nodes and the sense amplifier, and first and second transfer gates are provided between the write nodes and the bit lines and between the write nodes and the input-/output lines, respectively. Hence, during the read cycle data can be transferred between the bit-line sense amplifier and the input/output lines while the bit lines are being precharged with the read data latched in the sense amplifier. The precharging of the bit lines can, therefore, be performed during the RAS active period, reducing the cycle time significantly as compared to the prior art. During the write cycle, on the other hand, the bit lines and the input/output lines are electrically connected to each other, with the sense amplifier electrically disconnected from the bit lines, so that data on the input/output lines can directly be transferred to the bit lines and a memory cell is written into which is selected by a word line selected by a row address. Particularly by causing the $\overline{CAS}$ to go from "1" to "0" prior to the $\overline{RAS}$, a quick write operation is performed, and then the bit lines are precharged.

Figure 17A:
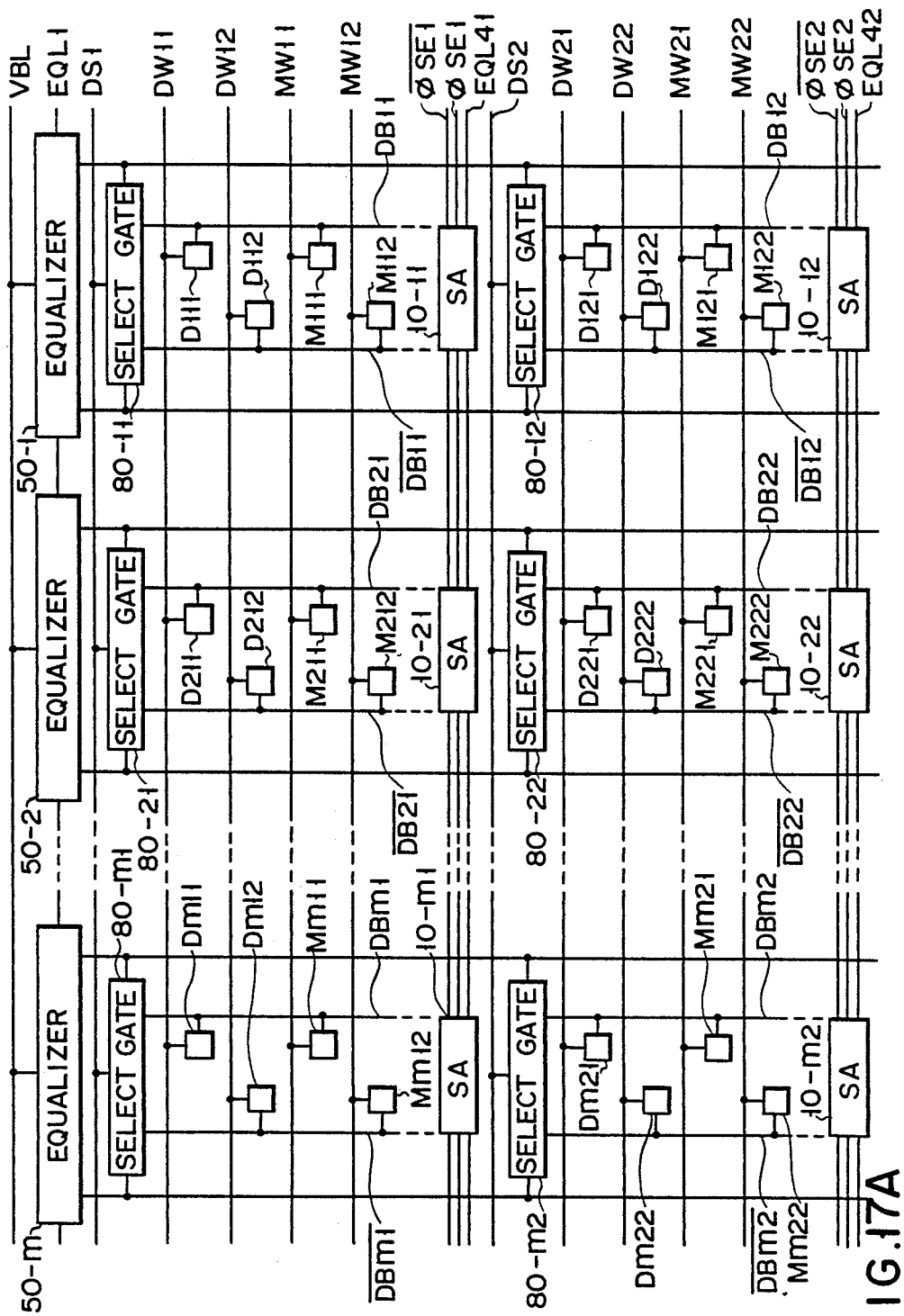
FIGS. 17A and 17B are a block diagram of a semiconductor memory according to a fifth embodiment of the present invention.
Figure 17B:
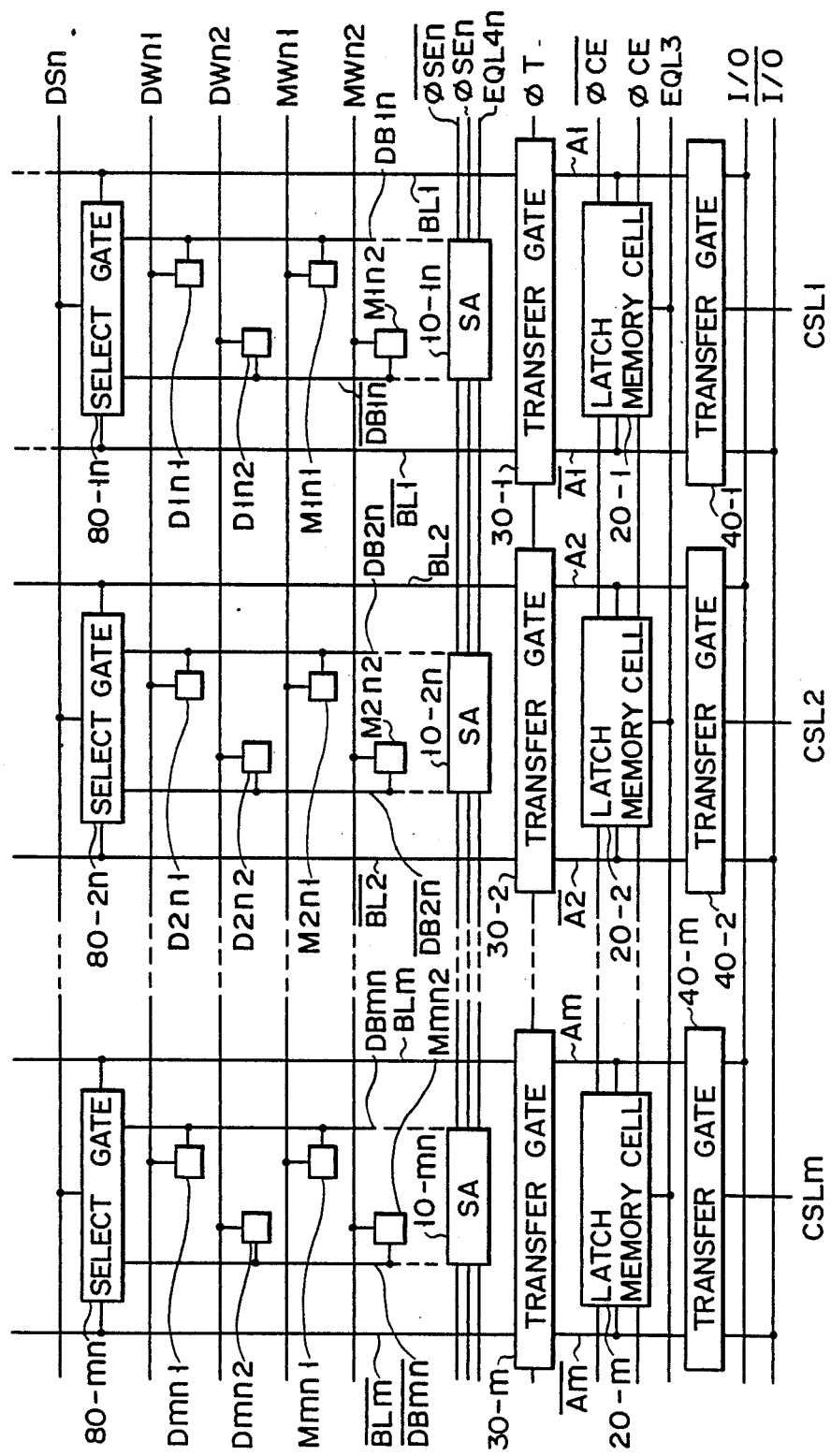

FIGS. 17A and 17B show the overall structure of the dRAM according to a fifth embodiment of the present invention in which a divided bit-line structure is applied to the dRAM of the third embodiment. On a semiconductor substrate a plurality of paired main bit lines BLi and $\overline{BLi}$ and a plurality of word lines MWij are disposed perpendicular to each other. To each pair of main bit lines BLi and $\overline{BLi}$ are connected a plurality of paired divided bit lines DBij and $\overline{DBij}$ via corresponding select gates 80-ij. A plurality of dRAM cells Mij1, Mij2, ... and two dummy cells Dij1, Dij2 are provided for each pair of divided bit lines DBij and $\overline{DBij}$. A divided bit-line latch-type sense amplifier 10-ij is provided for each pair of divided bit lines DBij and $\overline{DBij}$. Main bit-line pair BLi and $\overline{BLi}$ have their one end connected to main bit-line equalizer 50-i and their other end connected to latch memory cell 20-i via first transfer gate 30-i. Nodes Ai and $\overline{Ai}$ of latch memory cell 20-i are connected to input/output lines I/O and $\overline{I/O}$ via second transfer gate 40-i.

Figure 18:
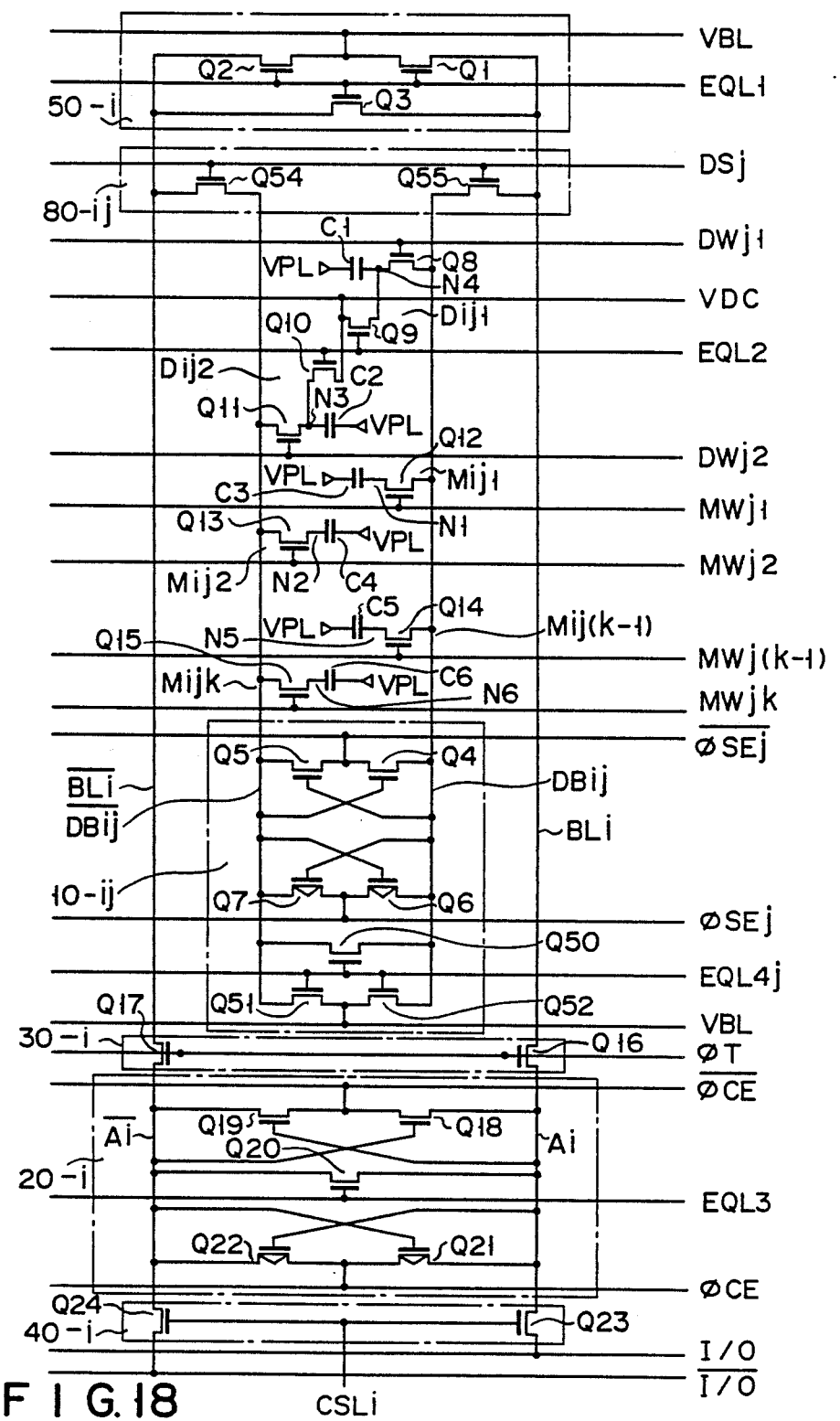
FIG. 18 is a circuit diagram of a portion of the fifth embodiment.

FIG. 18 shows a specific arrangement of the dRAM of the fifth embodiment, particularly of one row associated with the i-th main bit line pair BLi and $\overline{BLi}$. Divided bit-line sense amplifier 10-ij includes a flip-flop comprised of a pair of n-channel MOS transistors Q5, Q6 and another flip-flop comprised of a pair of p-channel MOS transistors Q6, Q7. Activation signals $\phi$SEj and $\overline{\phi SEj}$ are applied to the source connections of the transistor pairs, respectively. Divided bit-line sense amplifier 10-ij is additionally provided with a divided bit-line equalize circuit comprised of n-channel transistors Q50, Q51, and Q52 connected to receive equalize signal EQL4j.

Main bit-line equalize circuit 50-i is comprised of n-channel MOS transistors Q1, Q2, and Q3. The sources of transistors Q1 and Q2 are connected to main bit lines BLi and $\overline{BLi}$, respectively, and the drains thereof are connected to precharge power supply VBL. The gates of transistors Q1, Q2, and Q3 are supplied with main bit-line equalize signal EQL1.

Select gate 80-ij is comprised of n-channel MOS transistors Q54 and Q55 whose gates are supplied with a divided bit-line select signal DSj. In the other respects, the dRAM of the fifth embodiment is the same as the first embodiment.

Figure 19A:
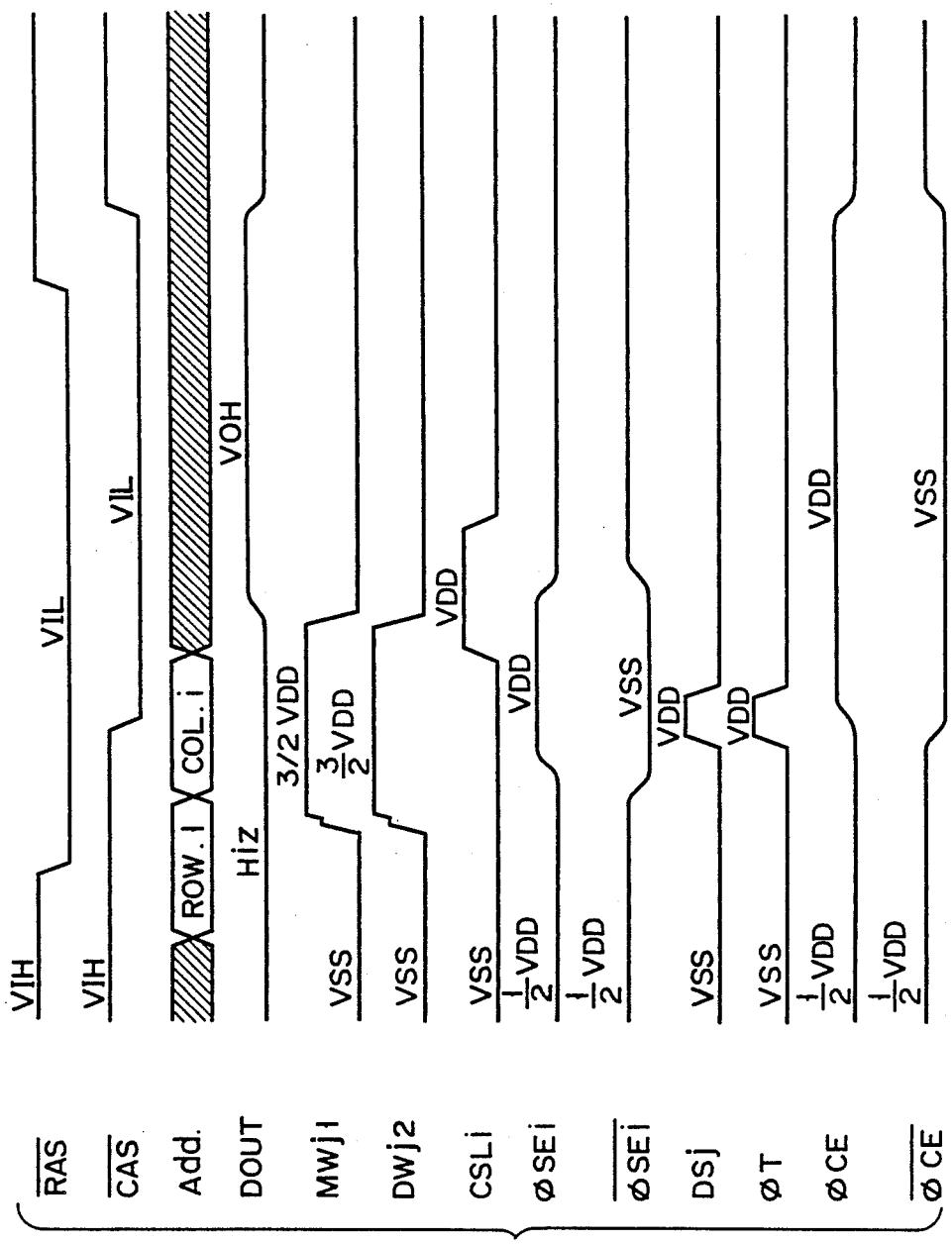
FIGS. 19A and 19B show waveforms of signals indicating the operation in a readout cycle of the fifth embodiment.
Figure 19B:
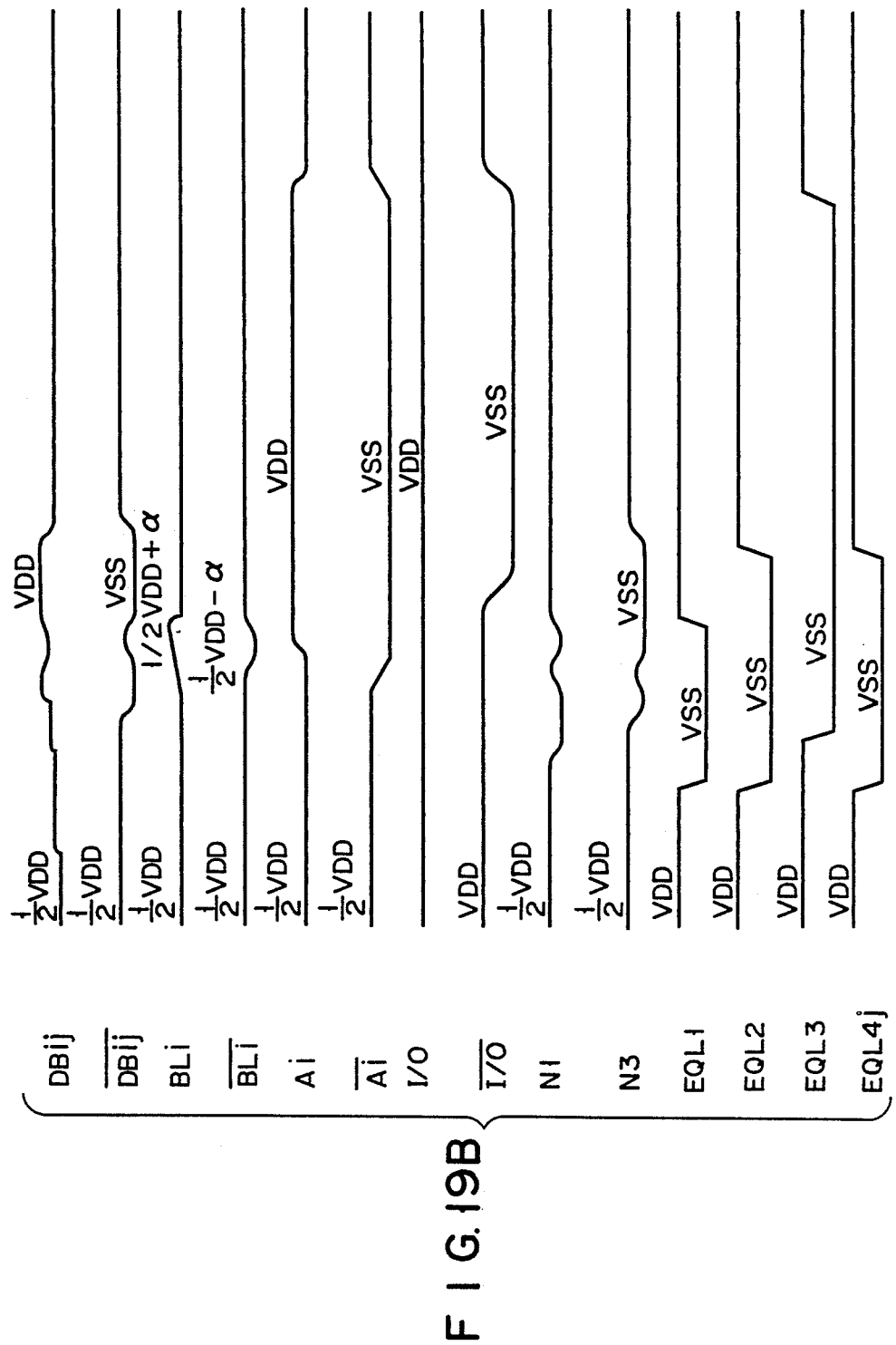

The read operation of the dRAM constructed above will be described with reference to FIGS. 19A and 19B. The Figure also shows signal waveforms for the case where the main bit lines and the divided bit lines are precharged to ($\frac{1}{2}$) VDD, and data in the latch memory cell is transferred to the input/output lines for read operation while the main bit lines and the divided bit lines are being precharged.

First, since main bit-line equalize signal EQL1 is at VDD and bit-line precharge power supply VBL is at ($\frac{1}{2}$) VDD, main bit lines BLi and $\overline{BLi}$ are all precharged to ($\frac{1}{2}$) VDD. Similarly, divided bit lines DBij and $\overline{DBij}$ are all precharged to ($\frac{1}{2}$) VDD because divided bit-line equalize signal EQL4j is at VDD.

Assume now that VDD (logic "1") is written into capacitor node N1 of dRAM cell Mij1 associated with the j-th divided bit-line pair DBij and $\overline{DBij}$ of interest for the i-th main bit line pair BLi and $\overline{BLi}$. In addition capacitor node N3 of dummy cell Dij2 is initially set to ($\frac{1}{2}$) VDD by write power supply VBL.

When the $\overline{RAS}$ goes from logic "1" (VIH) to logic "0", the operation goes into the RAS active mode. When equalize signals EQL1, EQL4j, EQL2 go from VDD to VSS and the level of word line MWj1 selected by a row address and dummy word line DWj2 goes from VSS to (3/2) VDD, the contents of dRAM cell Mij1 and dummy cell Dij2 are transferred to divided bit lines DBij and $\overline{DBij}$, respectively. At the same time equalize signal EQL2 for the latch memory cell goes from VDD to VSS.

Thereafter n-channel transistor activation signal $\overline{\phi SE}$ for divided bit-line sense amplifier 10-ij goes from ($\frac{1}{2}$) VDD to VSS and p-channel transistor activation signal $\phi$SE subsequently goes from ($\frac{1}{2}$) VDD to VDD. Consequently, divided bit line DBij onto which logic "1" data was read out is raised to VDD, while divided bit line $\overline{DBij}$ onto which data of dummy cell Dij2 was read out is lowered to VSS.

While divided bit lines DBij and $\overline{DBij}$ make transistors toward VDD and VSS, respectively, divided bit-line select signal DSj and first transfer gate control signal $\phi$T go from VSS to VDD with the result that data on divided bit lines DBij and $\overline{DBij}$ are transferred to nodes Ai and $\overline{Ai}$ of latch memory cell 20-i via main bit lines BLi and $\overline{BLi}$.

Thereafter latch memory cell activation signal $\phi$CE goes from ($\frac{1}{2}$) VDD to VDD, while activation signal $\overline{\phi CE}$ goes from ($\frac{1}{2}$) VDD to VSS. During that transfer of data, main bit lines BLi and $\overline{BLi}$ make the respective transitions to VDD and VSS. Before the complete transitions of the main bit lines, control signal DSj for select gate 80-ij and control signal $\phi$T for first transfer gate 30-i are lowered from VDD to VSS so as to electrically disconnect divided bit lines DBij and $\overline{DBij}$ and latch memory cell 20-i from main bit lines BLi and $\overline{BLi}$. This is done to speed up the latch operation, to reduce the power dissipation and to speed up the rewrite (restore) operation for the dRAM cells.

The disconnected main bit lines BLi and $\overline{BLi}$ are precharged to ($\frac{1}{2}$) VDD because main bit-line equalize signal EQL1 goes from VSS to VDD. Depending on the array arrangement and the memory capacitance, the capacitance of the main bit lines will be above 2pF in the case of a 16-Mbit dRAM, for instance. The restoring of the dRAM cells by the divided bit lines and latching of data by the latch memory cell under the condition of connection of the main bit-line capacitance would not only take a time but also require the large dissipation of power in order to charge and discharge main bit lines BLi and $\overline{BLi}$ to VDD and VSS. In this respect, this embodiment is arranged to precharge main bit lines BLi and $\overline{BLi}$ before the transitions thereof to VDD and VSS, resulting in reduced power dissipation. The final precharged levels of main bit lines BLi and $\overline{BLi}$ are (½) VDD+α and (½) VDD−α, respectively. α may be about (1/10) VDD.

Thereafter divided bit lines DBij and $\overline{DBij}$ go to VDD and VSS, respectively. After dRAM cells have sufficiently been restored, selected word line MWj1 and dummy word line DWj2 are lowered from (3/2) VDD to VSS, going into nonselected state.

Divided bit line equalize signal EQLj and dummy cell equalize signal EQL2 subsequently go from VSS to VDD, beginning the equalizing and precharging of the divided bit lines.

A series of operations of selecting the word line, operating the divided bit-line sense amplifier, transferring data to the latch memory cell, precharging the main bit lines, resetting the word line and precharging the divided bit lines is automatically performed by the $\overline{RAS}$ going from logic "1" to "0".

Independently of the above operation, when, for example, the i-th column is selected by the $\overline{CAS}$ going from "1" to "0", column select line CSLi goes from VSS to VDD or (3/2) VDD, electrically connecting nodes Ai and $\overline{Ai}$ to input/output lines I/O and $\overline{I/O}$. In this case, I/O remain at VDD, while $\overline{I/O}$ goes from VDD to VSS, changing output terminal Dout from Hiz to logic "1" level.

The $\overline{RAS}$ subsequently goes from "0" to "1". When $\overline{CAS}$ goes from "0" to "1" in this state, latch memory cell activation signals φCE and $\overline{\phi CE}$ return to the former (½)VDD, resetting all the latch memory cells.

As described above, according to the fifth embodiment of the present invention, a plurality of divided bit-line pairs are connected to a main bit-line pair, dRAM cells are connected to each divided bit-line pair, a latch memory cell is connected to the main bit-line pair. Data can, therefore, be transferred between the dRAM chip and the outside during the precharge period. Hence, since there is no need for the RAS precharge period, the cycle time can be shortened. In addition, the latch operation of the latch memory cell and the rewrite operation for the dRAM cells by means of the divided bit lines can be speeded up, and since the main bit lines need not be charged or discharged completely, the power dissipation can be reduced.

Figure 20A:
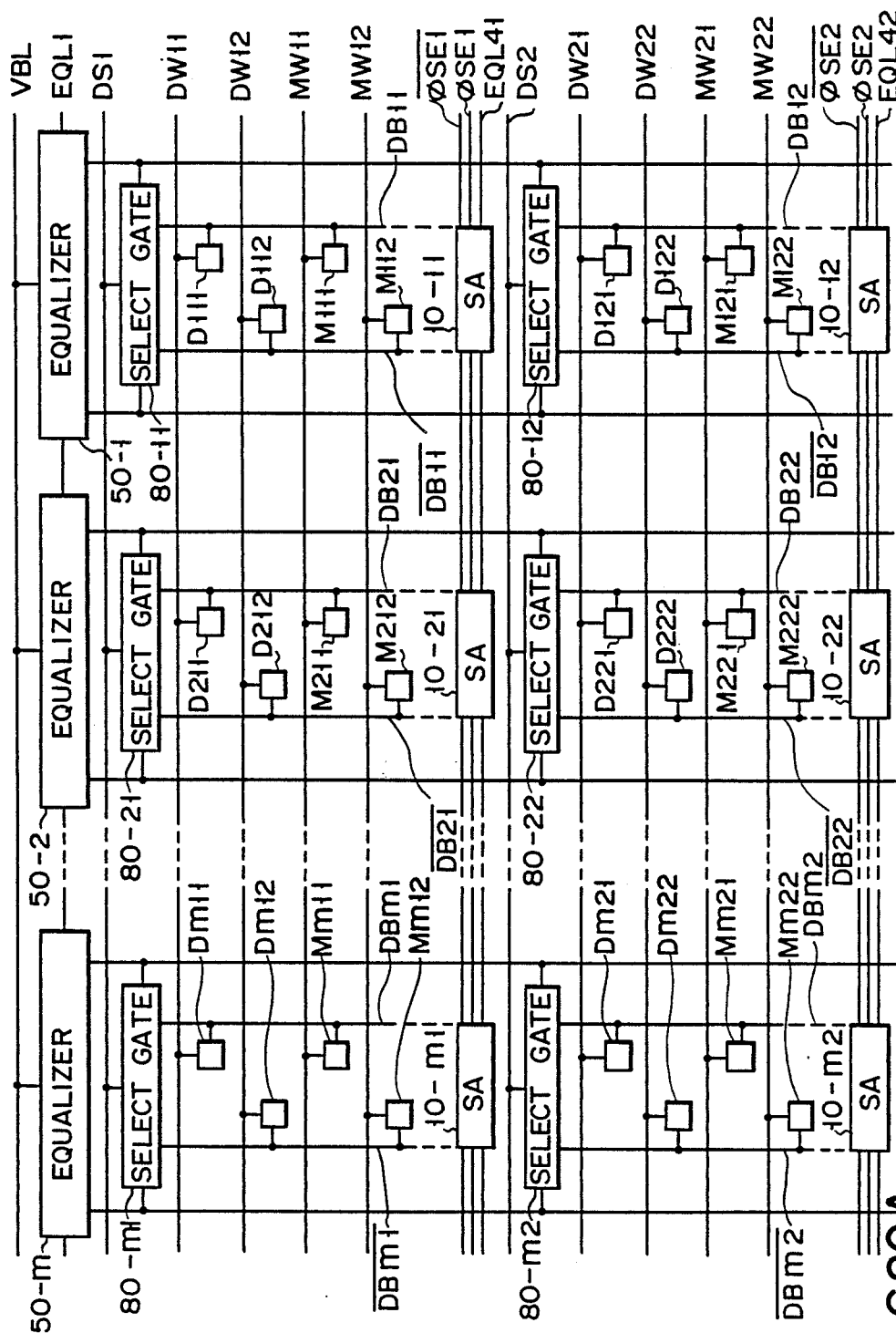
FIGS. 20A and 20B are a block diagram of a semiconductor memory according to a sixth embodiment of the present invention.
Figure 20B:
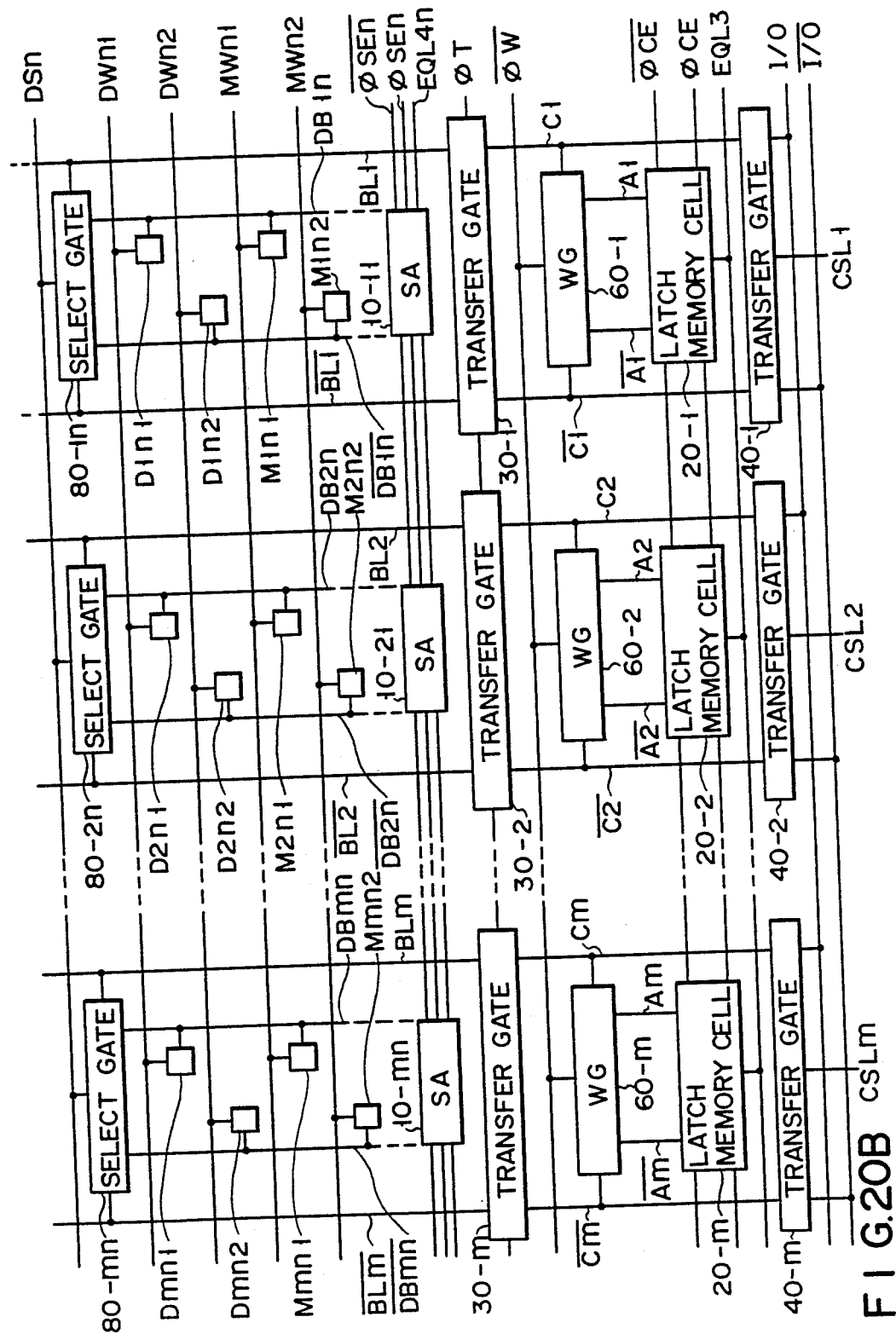

FIGS. 20A and 20B show an arrangement of a portion of a dRAM according to a sixth embodiment of the present invention. According to this embodiment, write gates are added to the arrangement of the fifth embodiment in order to electrically disconnecting a latch memory cell 20-i from bit lines BLi and $\overline{BLi}$ at a time of writing data. FIG. 20A is identical to FIG. 17A. As shown in FIG. 20B, a write gate 60-i is connected to precede latch memory cell 20-i of the fifth embodiment.

Figure 21:
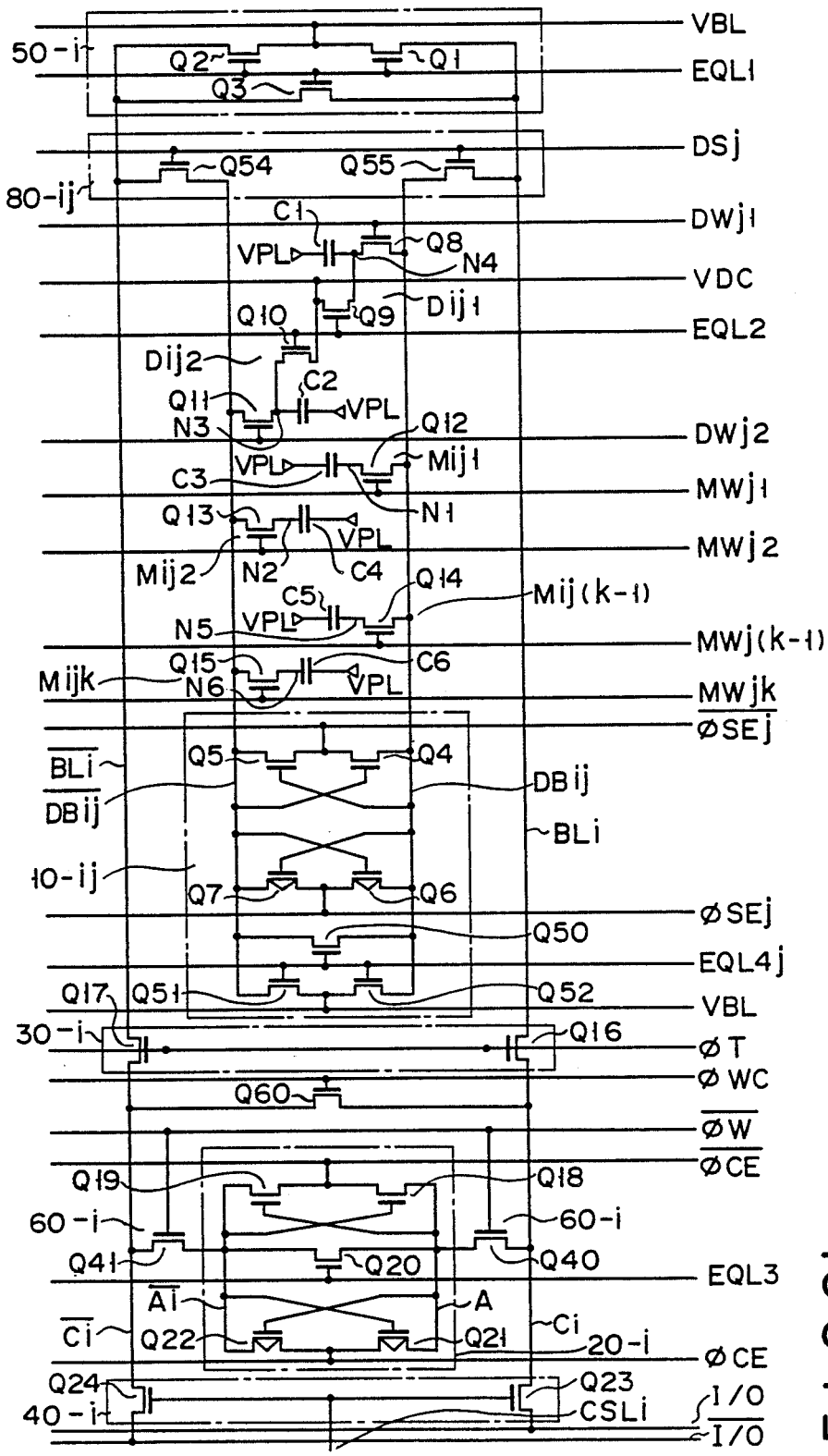
FIG. 21 is a circuit diagram of a portion of the sixth embodiment.

FIG. 21 shows a detailed circuit diagram for one row of the sixth embodiment, particularly of a row connected to the i-th main bit lines BLi and $\overline{BLi}$. Write gate 60-i is comprised of n-channel MOS transistors Q40, Q41 and Q60. The gates of transistors Q40 and Q41 are supplied with $\overline{\phi W}$ and the gate of transistor Q60 is supplied with φw. The remaining configuration is the same as the configuration of FIG. 18.

Figure 22A:
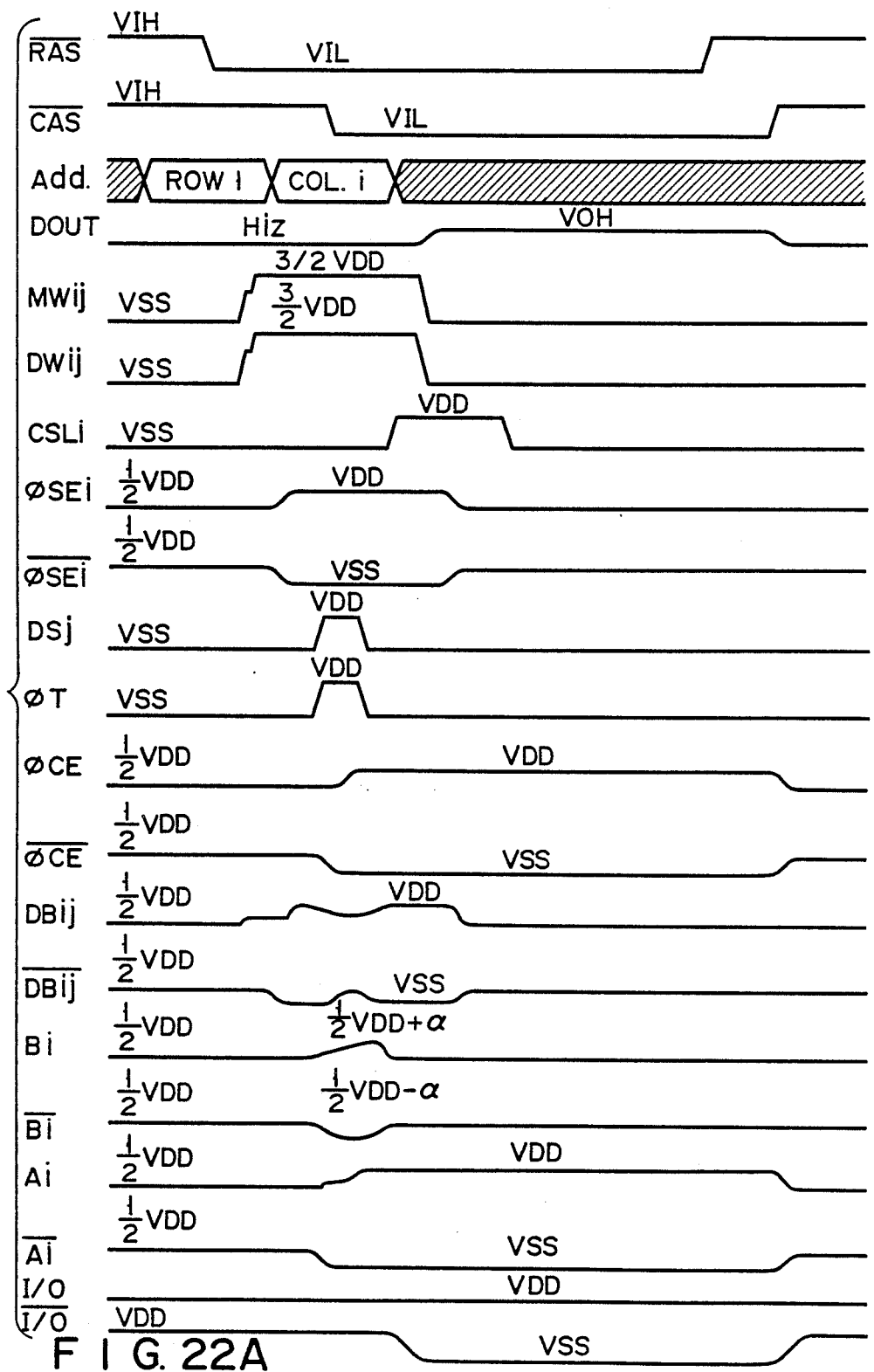

The operation of the dRAM constructed above will be described with reference to FIGS. 22A and 22B. These Figures also show signal waveforms for the case where the main bit lines and the divided bit lines are precharged to (½) VDD, and data in the latch memory cell is transferred to the input/output lines for read operation while the main bit lines and the divided bit lines are being precharged.

First, since main bit-line equalize signal EQL1 is at VDD and bit-line precharge power supply VBL is at (½) VDD, main bit lines BLi and $\overline{BLi}$ are all precharged to (½) VDD. Similarly, divided bit lines DBij and $\overline{DBij}$ are all precharged to (½) VDD because divided bit-line equalize signal EQL4j is at VDD.

Assume now that VDD (logic "1") is written into capacitor node N1 of dRAM cell Mij1 associated with the j-th divided bit-line pair DBij and $\overline{DBij}$ of interest for the i-th main bit-line pair BLi and $\overline{BLi}$. In addition, capacitor node N3 of dummy cell Dij2 is initially set to (½) VDD by write power supply VBL.

When the $\overline{RAS}$ goes from logic "1" (VIH) to logic "0" (VIL) prior to $\overline{CAS}$, the operation goes into the RAS active period. In this period, equalize signals EQL1, EQL4j, EQL2 go from VDD to VSS and the level of word line MWj1 and dummy word line DWj2 selected by a row address goes from VSS to (3/2) VDD. As a result, the contents of dRAM cell Mij1 and dummy cell Dij2 are transferred to divided bit lines DBij and $\overline{DBij}$, respectively. At the same time equalize signal EQL3 for the latch memory cell goes from VDD to VSS.

Thereafter n-channel transistor activation signal $\overline{\phi SE}$ for divided bit-line sense amplifier SAij goes from (½) VDD to VSS and p-channel transistor activation signal φSE subsequently goes from (½) VDD to VDD. Consequently, divided bit line DBij onto which logic "1" data was read out is raised to VDD, while divided bit line $\overline{DBij}$ onto which data of dummy cell Dij2 was read out is lowered to VSS.

While divided bit lines DBij and $\overline{DBij}$ make transitions toward VDD and VSS, respectively, divided bit-line select signal DSij and first transfer gate control signal φT go from VSS to VDD with the result that data on divided bit lines DBij and $\overline{DBij}$ are transferred to write nodes Ci and $\overline{Ci}$ of latch memory cell 20-i via main bit lines BLi and $\overline{BLi}$. During the read cycle control signal φW for write transfer gate 60-i is at VDD or (3/2) VDD so that data at nodes Ci and $\overline{Ci}$ are transferred to nodes Ai and $\overline{Ai}$ via write transfer gate 60-i which is turned on.

Thereafter latch memory cell activation signal φCE goes from (½) VDD to VDD, while activation signal $\overline{\phi CE}$ goes from (½) VDD to VSS. During that transfer of data, main bit lines BLi and $\overline{BLi}$ make the respective transitions to VDD and VSS. Before the complete transitions of the main bit lines, control signal DSj for select gate 80-ij and control signal φT for first transfer gate 30-i are lowered from VDD to VSS so as to electrically disconnect divided bit lines DBij and $\overline{DBij}$ and latch memory cell 20-i from main bit lines BLi and $\overline{BLi}$. This is done to speed up the latch operation, to reduce the power dissipation and to speed up the rewrite (restore) operation for the dRAM cells.

The disconnected main bit lines BLi and $\overline{BLi}$ are precharged to (½) VDD because main bit-line equalize signal EQL1 goes from VSS to VDD. Depending on the array arrangement and the memory capacitance, the capacitance of the main bit lines will be above 2pF in the case of a 16-Mbit dRAM, for instance. The restoring of the dRAM cells by the divided bit lines and latching of data by the latch memory cell under the condition of connection of the main bit-line capacitance would not only take a time but also require the large dissipation of power in order to charge and discharge main bit lines BLi to VDD and VSS. In this respect, this embodiment is arranged to precharge main bit lines BLi and $\overline{BLi}$ before the transitions thereof to VDD and VSS, resulting in reduced power dissipation. The final precharge levels of main bit lines BLi and $\overline{BLi}$ are $(\frac{1}{2})$ VDD$+\alpha$ and $(\frac{1}{2})$ VDD$-\alpha$, respectively. $\alpha$ may be about (1/10) VDD.

Thereafter divided bit lines DBij and $\overline{DBij}$ go to VDD and VSS, respectively. After dRAM cells have sufficiently been restored, selected word line MWj1 and dummy word line DWj2 are lowered from (3/2) VDD to VSS, going into nonselected state.

Divided bit line equalize signal EQLj and dummy cell equalize signal EQL2 subsequently go from VSS to VDD, beginning the equalizing and precharging of the divided bit lines.

A series of operations of selecting the word line, operating the divided bit-line sense amplifier, transferring data to the latch memory cell, precharging the main bit lines, resetting the word line and precharging the divided bit lines is automatically performed by the $\overline{RAS}$ going from logic "1" to "0".

Independently of the above operation, when, for example, the i-th column is selected by the $\overline{CAS}$ going from "1" to "0", column select line CSLi goes from VSS to VDD or (3/2) VDD, electrically connecting nodes Ai and $\overline{Ai}$ to input/output lines I/O and $\overline{I/O}$. In this case, I/O remain at VDD, while $\overline{I/O}$ goes from VDD to VSS, changing output terminal Dout from Hiz to logic "1" level.

The $\overline{RAS}$ subsequently goes from "0" to "1". When $\overline{CAS}$ goes from "0" to "1" in this state, latch memory cell activation signals $\phi CE$ and $\overline{\phi CE}$ return to the former $(\frac{1}{2})$ VDD, resetting all the latch memory cells.

Figure 23B:
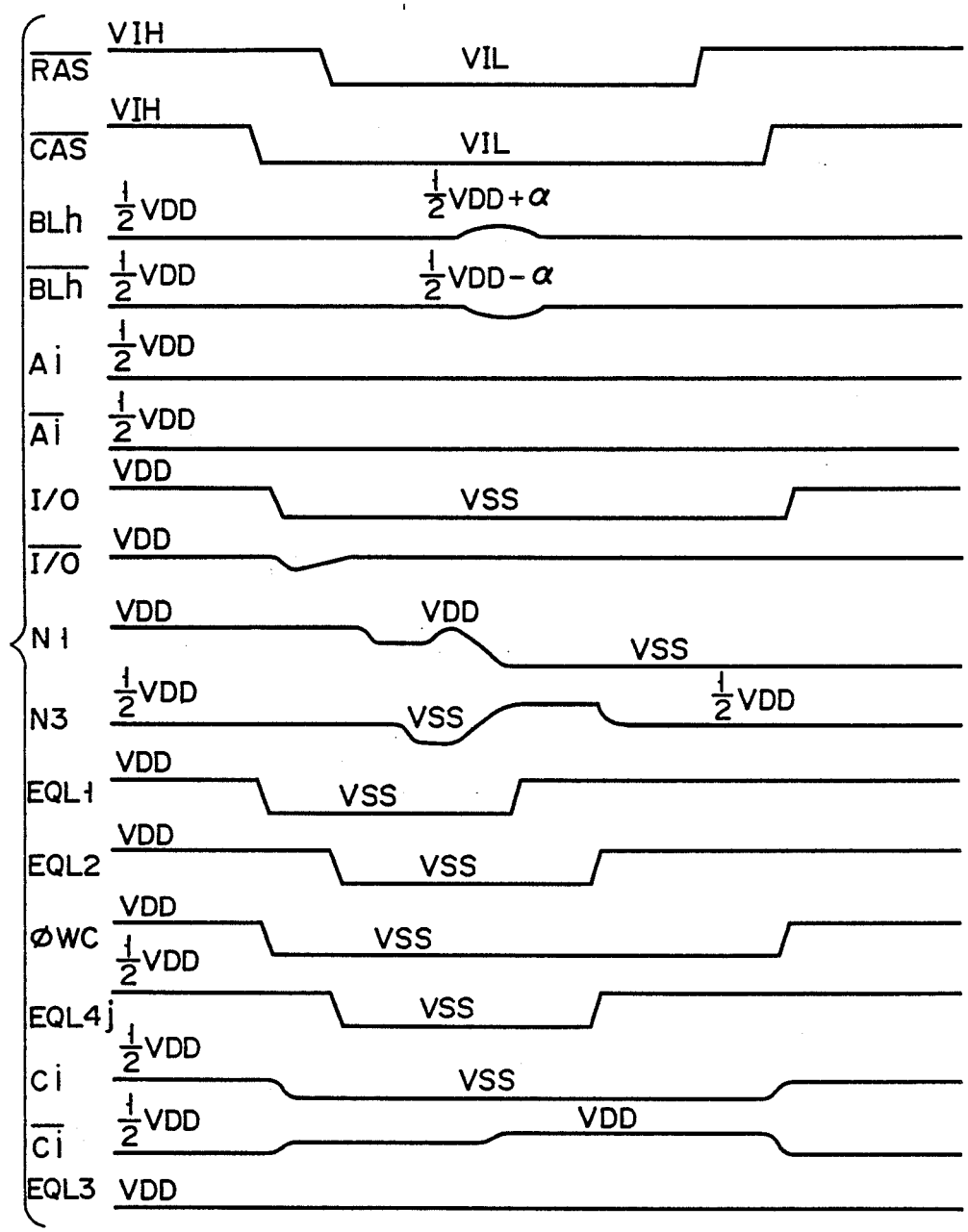

FIGS. 23A and 23B show signal waveforms representing the operation during a write cycle of the dRAM of the present embodiment. During the write cycle, $\overline{CAS}$ goes from logic "1" to logic "0" prior to $\overline{RAS}$, and at the same time main bit-line precharge signal EQL1 goes from VDD to VSS, causing main bit lines BLi and $\overline{BLi}$ to go into the floating state. The column address buffer is also rendered operative so that a column address is loaded.

If, for example, the i-th column is selected by the column address, then column address CSLi goes from VSS to VDD or (3/2) VDD, turning second transfer gate 40-i on. At the same time first transfer gate 30-i is also turned on by the rise of control signal $\phi T$. Write trigger signal $\overline{WE}$ becomes "0" simultaneously with CAS, and control signal $\overline{\phi W}$ goes to VSS so that write transfer gate 60-i is turned off.

As a result, latch memory cell 20-i is electrically disconnected from main bit lines BLi and $\overline{BLi}$. At the same time the write circuitry operates to activate the sense amplifier of input/output lines I/O and $\overline{I/O}$. If write input data "0", I/O goes from VDD to VSS, while $\overline{I/O}$ immediately returns to VDD after being slightly lowered because electrons flow into the bit line BLi.

In this way the write data is transferred from input/output lines I/O and $\overline{I/O}$ to main bit lines BLi and $\overline{BLi}$. Bit line BLi goes from $(\frac{1}{2})$ VDD to VSS, while bit line $\overline{BLi}$ goes $(\frac{1}{2})$ VDD to VDD or VDD-Vth.

Thereafter, when $\overline{RAS}$ goes "1" to "0", the row address buffer operates so that a row address is loaded. Assuming now that the j-th bit-line pair is selected by the row address, divided bit-line equalize signal EQL4j and dummy cell equalize signal EQL2 go from VDD to VSS so that the divided bit-line pair goes into the floating state. Thereafter word line MWj1 and dummy word line DWi2 go in level from VSS to (3/2) VDD or VDD.

Thereafter n-channel transistor activation signal $\phi SEj$ for the divided bit-line sense amplifier goes from $(\frac{1}{2})$ VDD to VSS, while p-channel transistor activation signal $\overline{\phi SEj}$ subsequently goes from $(\frac{1}{2})$VDD to VDD. Divided bit line DBij onto which "1" data was read from memory cell Mij1 goes to VDD, while divided bit line $\overline{DBij}$ onto which data has been read out of dummy cell Dij2 goes to VSS. During the level transition of the divided bit lines, divided bit-line select signal DSi goes from VSS to VDD so that write data on main bit lines BLi and $\overline{BLi}$ are transferred to divided bit lines DBij and $\overline{DBij}$ via select gate 80-ij. In this case, since the write data is "0", as opposed to "1" which has previously been stored, a potential relationship between divided bit lines DBij and $\overline{DBij}$ is reversed with the result that DBij go from VDD to VSS, while $\overline{DBij}$ goes from VSS to VDD.

Divided bit-line select signal DSi and first transfer gate control signal $\phi t$ are lowered from VDD to VSS before main bit lines BLh and $\overline{BLh}$ for nonselected columns make complete transitions to VDD and VSS, respectively. Consequently, divided bit lines DBih and $\overline{DBih}$ are electrically disconnected from main bit lines BLh and $\overline{BLh}$. This is done, as in the read cycle, to speed up the rewriting of memory cells and to reduce power dissipation.

All of the selected j-th divided bit lines DBj and $\overline{DBj}$ subsequently go to VDD and VSS, respectively, and when the memory cells connected to a selected word line are sufficiently rewritten into, selected word line MWj1 and dummy word line DWj2 are reset from (3/2) VDD to VSS.

Next divided bit-line equalize signal EQL4 goes from VSS to VDD to initiate the equalizing and precharging of the divided bit lines. Thereafter $\overline{WE}$, $\overline{RAS}$ and $\overline{CAS}$ go from logic "0" to logic "1", write transfer-gate control signal $\overline{\phi W}$ goes from VSS to VDD, and column address signal CSLi goes to VSS so that input/output lines I/O, $\overline{I/O}$ and write nodes Ci, $\overline{Ci}$ are reset.

In the read mode of operation, $\overline{RAS}$ precedes $\overline{CAS}$. When the delay of $\overline{CAS}$ is small, the column address-buffer control signal is gated without rising until clocks for $\overline{RAS}$ informing that the row address has been loaded rise. Conversely, in the write mode of operation, $\overline{CAS}$ precedes $\overline{RAS}$. When the delay of $\overline{RAS}$ is small, the row address-buffer control signal is gated without rising until clocks for $\overline{CAS}$ informing that the column address has been loaded rise.

As described above, according to the sixth embodiment, a plurality of divided bit-line pairs are connected to a main bit-line pair, dRAM cells are connected to each divided bit-line pair, and a latch memory cell is connected to the main bit-line pair. Data can, therefore, be transferred between the dRAM chip and the outside during the precharge period. Hence, since there is no need for the RAS precharge period, the cycle time can be shortened. In addition, the latch operation of the latch memory cell and the rewrite operation for the dRAM cells by means of the divided bit lines can be speeded up, and since the main bit lines need not be charged or discharged completely, the power dissipation can be reduced. Furthermore, the latch memory cell is connected to the write nodes via the write transfer gate, and the write nodes are further connected to the main bit lines and the input/output lines via first and second transfer gates. Thus, in the write cycle, by turning the write transfer gate off and turning the first and second transfer gates on so that the input/output lines may be electrically connected to the main bit lines, and further, in this case, by causing $\overline{CAS}$ to precede $\overline{RAS}$ so that the column address may be loaded prior to the row address, it is possible to write data at high speed.

As described above, according to the present invention, a dynamic RAM can be provided which can reduce the cycle time by precharging the bit lines during the RAS active period.

Although the preferred embodiments of the present invention have been disclosed and described, it is apparent that other embodiments and modifications are possible. For example, modifications of an embodiment may be applied to the other embodiments.

What is claimed is:

1. A semiconductor memory device comprising:
   a plurality of bit lines and a plurality of word lines disposed perpendicular to one another on a semiconductor substrate;
   a plurality of dynamic memory cells disposed at intersections of said bit lines and said word lines;
   equalizer means connected to said bit lines;
   sense amplifier means connected to said bit lines;
   latch means connected to said bit lines; and
   means, for, when a row address strobe signal for loading a row address into the memory device is active during a read cycle, selecting a word line, causing said latch means to latch data read from memory cells connected to the selected word line, then ceasing the selection of said word line, and causing said equalizer means to preset a level of the bit lines.

2. A semiconductor memory device according to claim 1, wherein said latch means is a static memory cell consisting of a flip-flop, said static memory cell being connected to a corresponding bit line via a first transfer gate and to an input/output line via a second transfer gate; wherein said first transfer gate is rendered conductive for a fixed time after the word line selection and said second transfer gate is rendered conductive by a column select signal selected when a column address strobe signal for loading a column address signal into the semiconductor memory device is active.

3. A semiconductor memory device according to claim 1, wherein said sense amplifier means is used as said latch means, and said sense amplifier means is a flop-flop connected to a corresponding bit line via a first transfer gate and to an input/output line via a second transfer gate, wherein said first transfer gate being rendered conductive for a fixed time after the word line selection, and said second transfer gate being rendered conductive by a column select signal selected when a column address strobe signal for loading a column address signal into the semiconductor memory device is active.

4. A semiconductor memory device according to claim 1, further comprising:
   means for serially accessing memory cell data latched into said latch means during the row address strobe signal's active period, by changing the level of the column address strobe signal for loading the column address signal into the semiconductor memory device.

5. A semiconductor memory device according to claim 1, wherein each of said bit lines comprises a plurality of divided bit lines to which a plurality of memory cells are connected and a main bit line to which said divided bit lines are connected via select gates; said sense amplifier means comprises divided bit line sense amplifiers each provided for each of said divided bit lines; and said latch means is connected to said main bit lines via first transfer gates which are rendered conductive after the word line selection and connected to input/output lines via second transfer gates which are rendered conductive by a column select signal selected when a column address strobe signal for loading a column address signal into the semiconductor memory device is active.

6. A semiconductor memory device according to claim 5, further comprising:
   means for preventing the potential of said main bit lines from becoming a power source potential when data in a memory cell is transferred from a divided bit line to said latch means via said main bit line.

7. A semiconductor memory device according to claim 5, further comprising:
   means for serially accessing memory cell data latched into said latch means during the row address strobe signal's active time period by changing the level of the column address strobe signal for loading the column address signal into the semiconductor memory device.

8. A semiconductor memory device according to claim 5, in which, in a read mode of operation, the row address strobe signal becomes active, the column address strobe signal becomes active, a signal informing that the row address has been loaded becomes active and a column address-buffer control signal is generated and, in a write mode of operation, the column address strobe signal becomes active, the row address strobe signal becomes active, a signal informing that the column address has been loaded becomes active, and a row address-buffer control signal is generated.

9. A semiconductor memory device according to claim 1, wherein an address multiplexing system is used in which a column address for selecting a bit line and a row address for selecting a word line are entered into said memory device via the same address terminals thereof, and wherein, both in a read cycle and in a write cycle, a column address is loaded by the column address strobe signal and then a row address is loaded by the row address strobe signal.

10. A semiconductor memory device comprising:
   a plurality of bit lines and a plurality of word lines disposed perpendicular to one another on a semiconductor substrate;
   a plurality of dynamic memory cells disposed at intersections of said bit lines and said word lines; and
   plural latch means connected to said bit lines for precharging said bit lines during a row address strobe signal's active period, each of said latch means being connected to a pair of write nodes via a write transfer gate, each of said pair of write nodes being connected to the bit lines via a first transfer gate pair and to an input/output line via a second transfer gate.

11. A semiconductor memory device according to claim 10, wherein, in a read cycle, the row address strobe signal for loading the row address signal into the semiconductor memory device is rendered active prior to a column address strobe signal for loading a column address signal into the semiconductor memory device so that a row address is loaded prior to a column address, and wherein, in a write cycle, the column address strobe signal is rendered active prior to the row address strobe signal so that a column address is loaded prior to a row address.

12. A semiconductor memory device according to claim 10, wherein, when the row address strobe signal for loading a row address signal into the semiconductor memory device is active in a read cycle, a word line is selected, the selection of the word line is ceased after data in memory cells connected to the word line is latched into said latch means, and the bit line is precharged by an equalizer; and, when after the row address strobe signal becomes nonactive and a column address strobe signal for loading a column address signal into the semiconductor memory device is active, when a column is selected, data in a sense amplifier is read out onto said input/output line irrespective of the precharging of said bit line.

13. A semiconductor memory device according to claim 10, wherein, when a column address strobe signal for loading a column address signal into the semiconductor memory device is active in a write cycle, when a write enable signal is rendered active, a column address is loaded, said write transfer gate is turned off, a column select line is selected by the column address, and data on said input/output line is transferred to said bit line via said first and second transfer gate; and when the row address strobe signal for loading a row address signal into the semiconductor memory device is active, a word line is selected by a row address, data on said bit line is written into a selected memory cell, said write transfer gate is turned on to connect said latch means to said bit line, rewrite said selected memory cell, reset said word line and precharge said bit line.

14. A semiconductor memory device according to claim 10, wherein said latch means is a static memory cell consisting of a flip-flop.

15. A semiconductor device according to claim 10, further comprising a sense amplifier which is used for each of said latch means.

16. A semiconductor memory device according to claim 10, further comprising:
means for serially accessing memory cell data latched into said latch means when the row address strobe signal is active, by changing the level of the column address strobe signal.

17. A semiconductor memory device according to claim 10, wherein each of said bit lines comprises a plurality of divided bit lines to which a plurality of memory cells are connected and a main bit line to which said divided bit lines are connected via select gates; said sense amplifier comprises a divided bit line sense amplifier provided for each of said divided bit lines; and said latch means is connected to said main bit line via a first transfer gate which is rendered conductive after the word line selection and connected to input/output lines via a second transfer gate which is rendered conductive by a column select signal selected when a column address strobe signal for loading a column address signal into the semiconductor memory device is active.

18. A semiconductor memory device according to claim 17, further comprising:
means for preventing the potential of said main bit lines from becoming a power source potential when data in said memory cell is transferred from a divided bit line to said latch means via said main bit line.

19. A semiconductor memory device according to claim 17, further comprising:
means for serially accessing memory cell data latched into said latch means when the row address strobe signal is active, by changing the level of the column address strobe signal.

20. A semiconductor memory device according to claim 17, in which, in a read mode of operation, the row address strobe signal becomes active, the column address strobe signal becomes active, a signal informing that the row address has been loaded becomes active, and a column address-buffer control signal is generated and, in a write mode of operation, the column address strobe signal becomes active, the row address strobe signal becomes active, a signal informing that the column address has been loaded becomes active, and a row address-buffer control signal is generated.

21. A semiconductor memory device comprising:
a plurality of bit lines and a plurality of word lines disposed perpendicular to one another on a semiconductor substrate;
a plurality of dynamic memory cells disposed at intersections of said bit lines and said word lines;
means, connected to said bit lines, for presetting an initial level of the bit lines;
sense amplifier means connected to said bit lines;
latch means connected to said bit lines; and means for, when a row address strobe signal for loading a row address into the memory device is active during a read cycle, selecting a word line, causing said latch means to latch data read from memory cells connected to the selected word line, then ceasing the selection of said word line, and causing said presetting means to preset the initial level of the bit lines.

* * * * *